US009607569B2

(12) United States Patent
Takahashi et al.

(10) Patent No.: US 9,607,569 B2
(45) Date of Patent: Mar. 28, 2017

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Kei Takahashi, Kanagawa (JP); Keita Sato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 14 days.

(21) Appl. No.: 14/844,436

(22) Filed: Sep. 3, 2015

(65) Prior Publication Data
US 2016/0071478 A1 Mar. 10, 2016

(30) Foreign Application Priority Data

Sep. 5, 2014 (JP) ................................. 2014-181113

(51) Int. Cl.
*G09G 3/36* (2006.01)
*H01L 27/12* (2006.01)
*H01L 29/786* (2006.01)

(52) U.S. Cl.
CPC ......... *G09G 3/3696* (2013.01); *G09G 3/3648* (2013.01); *G09G 3/3692* (2013.01); *H01L 27/124* (2013.01); *H01L 27/1225* (2013.01); *H01L 29/7869* (2013.01); *H01L 29/78696* (2013.01); *G09G 2300/0426* (2013.01);
(Continued)

(58) Field of Classification Search
CPC .. H01L 27/124; G09G 3/3275; G09G 3/3692; G09G 3/3696
See application file for complete search history.

(56) References Cited

U.S. PATENT DOCUMENTS 5,898,322 A * 4/1999 Kubota ................ H03K 19/215
326/103
7,605,830 B2 10/2009 Date
(Continued)

FOREIGN PATENT DOCUMENTS

CN 102163400 A 8/2011
DE 2930375 2/1980
(Continued)

OTHER PUBLICATIONS

International Search Report (Application No. PCT/IB2015/056458), dated Oct. 28, 2015.
(Continued)

*Primary Examiner* — Amare Mengistu
*Assistant Examiner* — Shawna Stepp Jones
(74) *Attorney, Agent, or Firm* — Fish & Richardson P.C.

(57) ABSTRACT

To provide a small driver IC, in a pass transistor logic circuit that converts k-bit digital signals into analog signals, transistors supplied with a first-bit signal are arranged in a line in the channel width direction. The channel width of transistors supplied with second to kth-bit signals is made larger than (e.g., preferably larger than two times and smaller than eight times) that of the transistors supplied with the first-bit signal. The transistors are preferably arranged such that transistors of the same conductivity type are located adjacent to each other wherever possible.

13 Claims, 18 Drawing Sheets

(52) U.S. Cl.
CPC .............. *G09G 2310/0297* (2013.01); *G09G 2330/021* (2013.01)

(56) References Cited

U.S. PATENT DOCUMENTS

| | | | |
|---|---|---|---|
| 8,094,107 B2 | 1/2012 | Nishimura et al. | |
| 8,446,403 B2 | 5/2013 | Tsuchi et al. | |
| 2007/0091053 A1* | 4/2007 | Kajiwara | G09G 3/2003 345/100 |
| 2011/0205218 A1 | 8/2011 | Tsuchi et al. | |
| 2015/0255492 A1 | 9/2015 | Takahashi et al. | |

FOREIGN PATENT DOCUMENTS

| | | |
|---|---|---|
| GB | 2029658 | 3/1980 |
| JP | 55-018016 A | 2/1980 |
| JP | 2006-091569 A | 4/2006 |
| JP | 2007-037191 A | 2/2007 |
| JP | 2007-286525 A | 11/2007 |
| JP | 2011-172100 A | 9/2011 |

OTHER PUBLICATIONS

Written Opinion (Application No. PCT/IB2015/056458), dated Oct. 28, 2015.

\* cited by examiner

V-gene

PTL10

28

28

PTL10

SEMICONDUCTOR DEVICE, ELECTRONIC COMPONENT, AND ELECTRONIC DEVICE

TECHNICAL FIELD

One embodiment of the present invention relates to a semiconductor device, an electronic component, or an electronic device.

In addition, one embodiment of the present invention relates to an object, a method, or a manufacturing method. One embodiment of the present invention relates to a process, a machine, manufacture, or a composition of matter. One embodiment of the present invention relates to a display device, a light-emitting device, a power storage device, a memory device, a driving method thereof, or a manufacturing method thereof.

In this specification and the like, a semiconductor device generally means a device that can function by utilizing semiconductor characteristics. A display device, an electro-optical device, a semiconductor circuit, and an electronic device include a semiconductor device in some cases.

BACKGROUND ART

A driver circuit of a display device is required to have higher performance to meet demand for multiple gray levels and higher definition of a display portion. Accordingly, an integrated circuit (IC, hereinafter also referred to as driver IC) is used as a driver circuit of a display device, particularly as a source driver (e.g., see Patent Document 1).

A small-size display device has been required for portable appliances such as a smart phone and a tablet. Furthermore, higher definition of a display device has been demanded; for example, an 8K ultra high definition (UHD) television with 7680 horizontal pixels by 4320 vertical pixels has been suggested.

REFERENCE

Patent Document 1: Japanese Published Patent Application No. 2007-286525

DISCLOSURE OF INVENTION

As a display device becomes smaller and has higher definition, a driver IC mounted on the display device is required to be reduced in size and operate at higher speed.

An object of one embodiment of the present invention is to provide a small driver IC. Another object of one embodiment of the present invention to provide a driver IC capable of high-speed operation. Another object of one embodiment of the present invention is to provide a novel driver IC. Another object of one embodiment of the present invention is to provide a small semiconductor device. Another object of one embodiment of the present invention to provide a semiconductor device capable of high-speed operation. Another object of one embodiment of the present invention is to provide a novel semiconductor device.

Note that the description of a plurality of objects does not mutually preclude the existence. Note that one embodiment of the present invention does not necessarily achieve all the objects listed above. Objects other than those listed above are apparent from the description of the specification, drawings, and claims, and such objects can be an object of one embodiment of the present invention.

One embodiment of the present invention is a semiconductor device including first to seventh transistors and first to fifth wirings. A gate of the first transistor is electrically connected to the first wiring. One of a source and a drain of the first transistor is supplied with a first voltage. The other of the source and the drain of the first transistor is electrically connected to one of a source and a drain of the fifth transistor. A gate of the second transistor is electrically connected to the second wiring. One of a source and a drain of the second transistor is supplied with a second voltage. The other of the source and the drain of the second transistor is electrically connected to the one of the source and the drain of the fifth transistor. A gate of the third transistor is electrically connected to the first wiring. One of a source and a drain of the third transistor is supplied with a third voltage. The other of the source and the drain of the third transistor is electrically connected to one of a source and a drain of the sixth transistor. A gate of the fourth transistor is electrically connected to the second wiring. One of a source and a drain of the fourth transistor is supplied with a fourth voltage. The other of the source and the drain of the fourth transistor is electrically connected to the one of the source and the drain of the sixth transistor. A gate of the fifth transistor is electrically connected to the third wiring. The other of the source and the drain of the fifth transistor is electrically connected to one of a source and a drain of the seventh transistor. A gate of the sixth transistor is electrically connected to the fourth wiring. The other of the source and the drain of the sixth transistor is electrically connected to the one of the source and the drain of the seventh transistor. A gate of the seventh transistor is electrically connected to the fifth wiring. The first wiring is supplied with a first signal. The second wiring is supplied with an inversion signal of the first signal. The third wiring is supplied with a second signal. The fourth wiring is supplied with an inversion signal of the second signal. The fifth wiring is supplied with a third signal. The channel width of each of the first to fourth transistors is preferably smaller than that of each of the fifth to seventh transistors.

In the above embodiment, the first to fourth transistors are preferably arranged in one line.

In the above embodiment, the first to seventh transistors preferably have the same conductivity type.

In the above embodiment, the channel width of each of the fifth to seventh transistors is preferably larger than two times and smaller than eight times that of each of the first to fourth transistors.

In the above embodiment, one of the first to fourth voltages is selected in response to the first to third signals and is output to the other of the source and the drain of the seventh transistor.

One embodiment of the present invention is an electronic component including the semiconductor device according to the above embodiment and a bump terminal electrically connected to the semiconductor device.

One embodiment of the present invention is an electronic device including the electronic component according to the above embodiment and a display device.

In this specification, the structures, the methods, and the like described in an embodiment can be combined as appropriate with any of the structures, the methods, and the like described in the other embodiments.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Since the source and the drain of the transistor change depending on the structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification, ordinal numbers such as first, second, and third are used to avoid confusion among components, and thus do not limit the number of the components.

In this specification, terms for explaining arrangement, such as over and under, are used for convenience to describe the positional relation between components with reference to drawings. The positional relation between components is changed as appropriate in accordance with a direction in which each component is described. Thus, the positional relation is not limited to that described with a term used in this specification and can be explained with another term as appropriate depending on the situation.

The positional relation of circuit blocks in a block diagram is specified for description. Even when a block diagram shows that different functions are achieved by different circuit blocks, one circuit block may be actually configured to achieve different functions. Functions of circuit blocks in a diagram are specified for description, and even when a diagram shows one circuit block performing given processing, a plurality of circuit blocks may be actually provided to perform the processing.

Note that the terms "film" and "layer" can be interchanged with each other depending on circumstances or situations. For example, in some cases, the term "conductive film" can be used instead of the term "conductive layer," and the term "insulating layer" can be used instead of the term "insulating film."

For example, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a line, an electrode, a terminal, a conductive film, or a layer).

Examples of the case where X and Y are directly connected include the case where an element that allows electrical connection between X and Y (e.g., a switch, a transistor, a capacitor, an inductor, a resistor, a diode, a display element, a light-emitting element, or a load) is not connected between X and Y, and the case where X and Y are connected without the element that allows electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through Z1 (or not through Z1) and a drain (or a second terminal or the like) of the transistor is electrically connected to Y through Z2 (or not through Z2), or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include "X, Y, and a source (or a first terminal or the like) and a drain (or a second terminal or the like) of a transistor are electrically connected to each other such that X, the source (or the first terminal or the like) of the transistor, the drain (or the second terminal or the like) of the transistor, and Y are electrically connected to each other in this order"; "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order"; and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope.

Another example of the expression is "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is possible to use the expression "a source (or a first terminal or the like) of a transistor is electrically connected to X through Z1 on at least a first connection path, the first connection path does not include a second connection path, the second connection path includes a connection path through the transistor, a drain (or a second terminal or the like) of the transistor is electrically connected to Y through Z2 on at least a third connection path, and the third connection path does not include the second connection path." It is also possible to use the expression "a source (or a first terminal or the like) of a transistor is electrically connected to X through Z1 on at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 on at least a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to the above examples, a source (or a first terminal or the like) and a drain (or a second terminal or the like) of a transistor can be distinguished from each other to specify the technical scope.

Note that these expressions are only examples, and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

One embodiment of the present invention can provide a small driver IC, a driver IC capable of high-speed operation, a novel driver IC, a small semiconductor device, a semiconductor device capable of high-speed operation, or a novel semiconductor device.

Note that the description of these effects does not preclude the existence of other effects. One embodiment of the present invention does not necessarily achieve all the effects listed above. Other effects will be apparent from and can be derived from the description of the specification, the drawings, the claims, and the like.

BEST MODE FOR CARRYING OUT THE INVENTION

Figure 1:
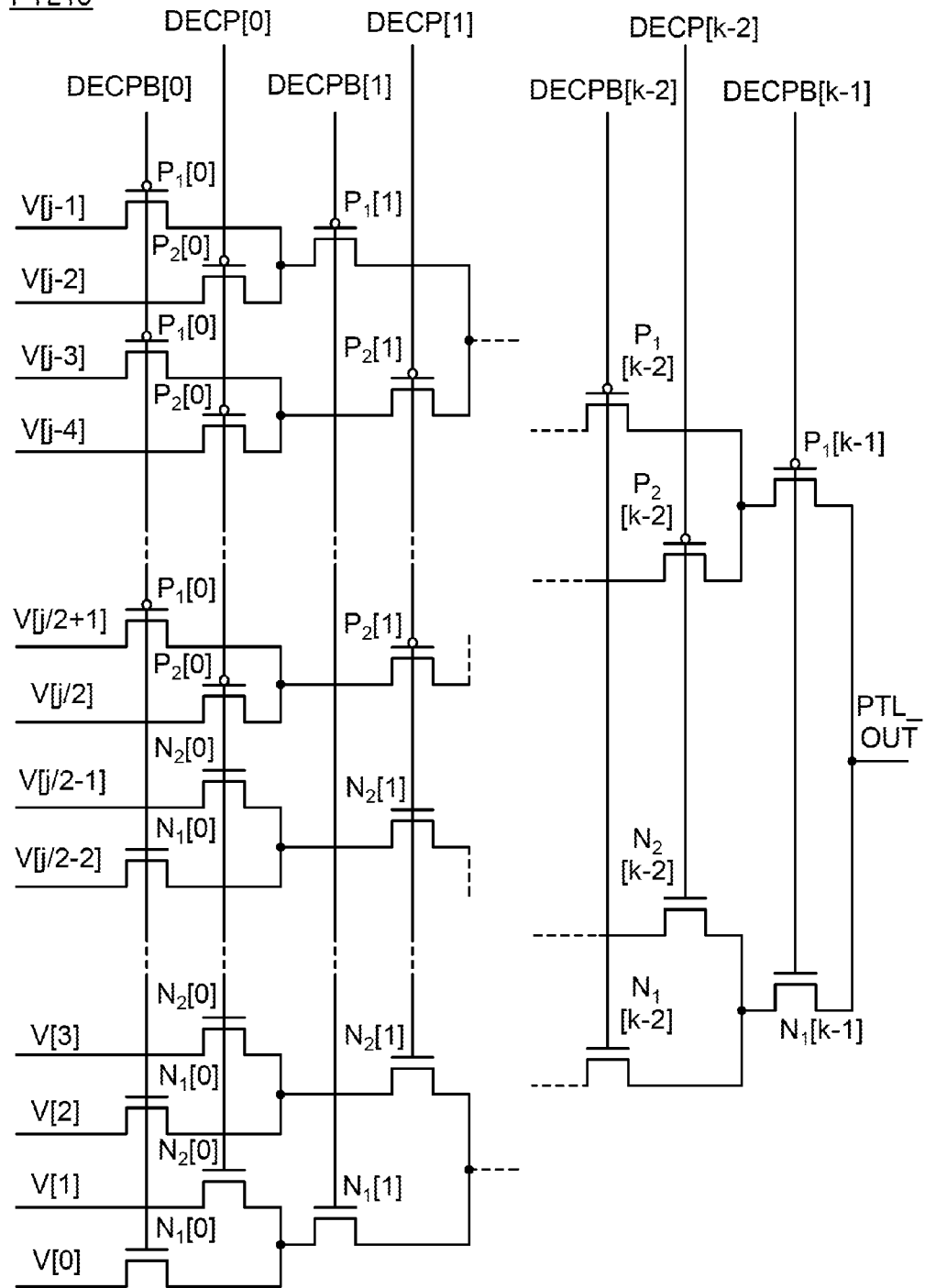
FIG. 1 is a circuit diagram illustrating one embodiment of the present invention.

Embodiments will be described below with reference to the drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or a region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, variation in signal, voltage, or current due to noise or difference in timing can be included.

Embodiment 1

In this embodiment, a pass transistor logic (hereinafter referred to as PTL) of one embodiment of the present invention will be described.

PTL Configuration Example 1

A PTL is a circuit having a function of converting an input digital signal into an analog signal. A data signal input to the PTL is a digital signal, and the digital data signal is converted into an analog signal by the PTL. The PTL may be referred to as a digital-to-analog (D/A) converter circuit or simply as a circuit. The PTL can be applied to a driver IC. FIG. 1 illustrates a circuit configuration of a PTL 10 as an example.

The PTL 10 includes transistors $P_1[0]$ to $P_1[k-1]$, transistors $P_2[0]$ to $P_2[k-2]$, transistors $N_1[0]$ to $N_1[k-1]$, and transistors $N_2[0]$ to $N_2[k-2]$. Note that k is a natural number of 2 or more.

The transistors $P_1[0]$ to $P_1[k-1]$ and the transistors $P_2[0]$ to $P_2[k-2]$ are preferably p-channel transistors. The transistors $N_1[0]$ to $N_1[k-1]$ and the transistors $N_2[0]$ to $N_2[k-2]$ are preferably n-channel transistors.

Signals DECPB[0] to DECPB[k-1] and signals DECP[0] to DECP[k-2] are input to the PTL 10. These signals are the aforementioned digital signals and are supplied from a level shifter described later.

The signal DECP[0] is an inversion signal of the signal DECPB[0]. Similarly, the signal DECP[k-2] is an inversion signal of the signal DECPB[k-2].

Note that in this specification, the signal DECPB[0] and the signal DECP[0] may be referred to as first-bit signals; the signal DECPB[k-2] and the signal DECP[k-2], (k-1)th-bit signals; and the signal DECPB[k-1], a kth-bit signal.

The signal DECPB[0] is supplied to gates of the transistor $P_1[0]$ and the transistor $N_1[0]$.

The signal DECP[0] is supplied to gates of the transistor $P_2[0]$ and the transistor $N_2[0]$.

The signal DECPB[k-2] is supplied to gates of the transistor $P_1[k-2]$ and the transistor $N_1[k-2]$.

The signal DECP[k-2] is supplied to gates of the transistor $P_2[k-2]$ and the transistor $N_2[k-2]$.

The signal DECPB[k-1] is supplied to gates of the transistor $P_1[k-1]$ and the transistor $N_1[k-1]$.

Voltages V[0] to V[j-1] (j is an even number of 2 or more) are supplied to the PTL 10 through the transistors $P_1[0]$, $P_2[0]$, $N_1[0]$, and $N_2[0]$. These voltages are generated by a voltage generator circuit V-gene illustrated in FIG. 2.

Figure 2:
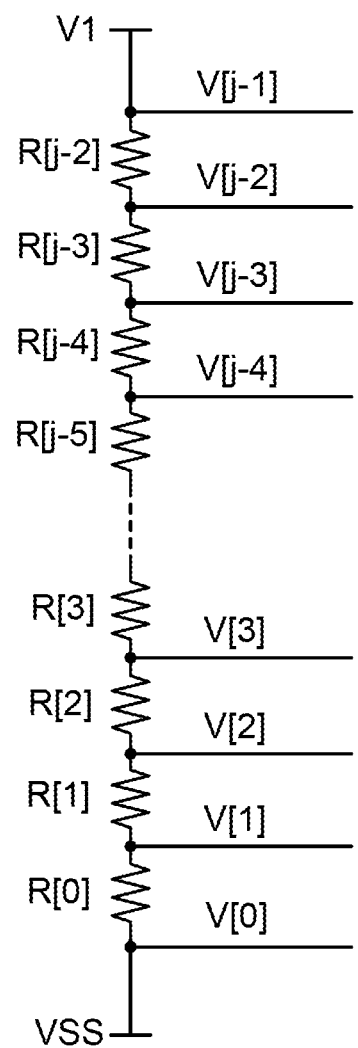
FIG. 2 is a circuit diagram illustrating one embodiment of the present invention.

The voltage generator circuit V-gene illustrated in FIG. 2 includes resistors R[0] to R[j-2] connected in series between wirings that apply a voltage V1/VSS. The voltages V[0] to V[j-1] are obtained by dividing the voltage V1/VSS by the resistors R[0] to R[j-2]. Note that the voltage V1/VSS refer to a voltage with an amplitude ranging from a high power supply potential V1 to a low power supply potential VSS. The low power supply potential VSS may be a ground potential GND.

As shown in FIG. 2, a smaller number in the bracket of the voltages V[0] to V[j-1] means a lower voltage, and a larger number in the bracket means a higher voltage.

The PTL 10 in FIG. 1 has a function of selecting one voltage from the voltages V[0] to V[j-1] in response to the signals DECPB[0] to DECPB[k-1] and the signals DECP[0] to DECP[k-2] input thereto and outputting the selected voltage as an analog signal from an output terminal PTL_OUT.

Figure 3:
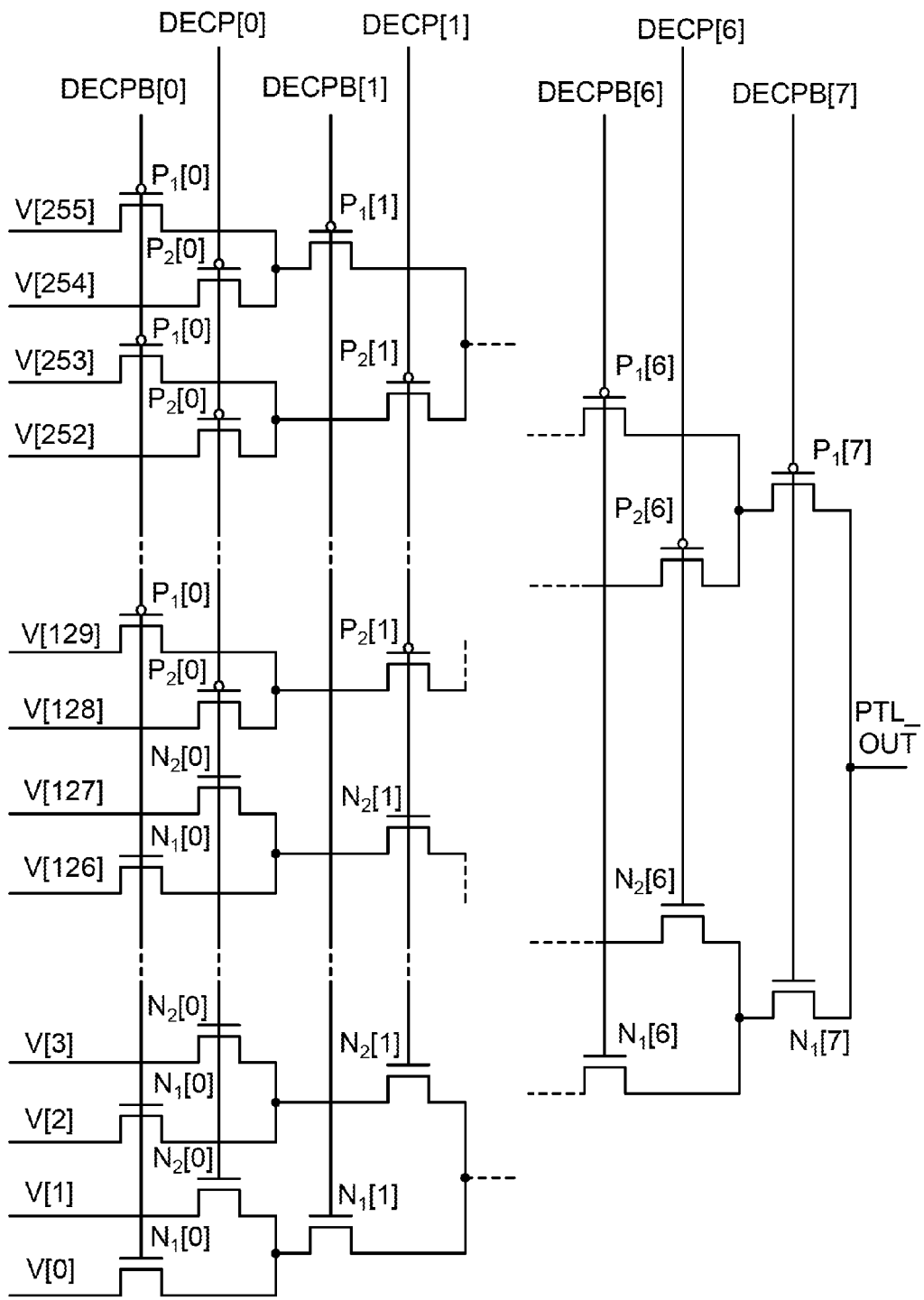
FIG. 3 is a circuit diagram illustrating one embodiment of the present invention.

FIG. 3 illustrates an example where 8-bit data signals (k=8) are input to the PTL 10 and analog signals corresponding to 256 gray levels (j=256) are output from the PTL 10. In this case, signals DECPB[0] to DECPB[7] and signals DECP[0] to DECP[6] are supplied to the PTL 10.

In FIG. 3, for example, when a low-level (hereinafter L-level) potential is supplied as the signals DECPB[0] to DECPB[7] and a high-level (hereinafter H-level) potential is supplied as the signals DECP[0] to DECP[6], a voltage V[255] is output to the output terminal PTL_OUT.

In FIG. 3, for example, when an H-level potential is supplied as the signals DECPB[0] to DECPB[7] and an L-level potential is supplied as the signals DECP[0] to DECP[6], the voltage V[0] is output to the output terminal PTL_OUT.

In the circuit diagram of FIG. 1, the lower half of the circuit supplied with the low voltages V[0] to V[j/2-1] is preferably composed of n-channel transistors (the transistors $N_1[0]$ to $N_1[k-1]$ and the transistors $N_2[0]$ to $N_2[k-2]$). The upper half of the circuit supplied with the high voltages V[j/2] to V[j-1] is preferably composed of p-channel transistors (the transistor $P_1[0]$ to $P_1[k-1]$ and the transistor $P_2[0]$ to $P_2[k-1]$). The reasons are explained below.

First, features of a p-channel transistor are considered. A p-channel transistor is turned on when an L-level potential is supplied to its gate. At this time, when a potential (one of the voltages V[0] to V[j-1]) supplied to the source of the transistor is low, a potential difference (Vgs) between the gate and the source becomes small. As a result, the resistance of the transistor in the on state (hereinafter referred to as on resistance) becomes large and circuit operation becomes slow. For this reason, the circuit on the high voltage side is preferably formed of p-channel transistors as illustrated in FIG. 1.

Next, features of an n-channel transistor are considered. When an H-level potential is supplied to the gate of an n-channel transistor, the transistor is turned on, and the source potential becomes close to a potential (one of the voltages V[0] to V[j-1]) supplied to its drain. At this time, when the potential supplied to the drain is high, Vgs becomes smaller than the threshold voltage (Vth) of the transistor before the potential of the drain becomes equal to that of the source, and the transistor is turned off. Consequently, the transistor outputs a voltage that is lower by Vth. For this reason, the circuit on the low voltage side is preferably formed of n-channel transistors as illustrated in FIG. 1.

Transistor Arrangement Example 1

Next, an arrangement example of transistors in the PTL 10 will be specifically described with reference to FIGS. 4A and 4B.

Figure 4A:
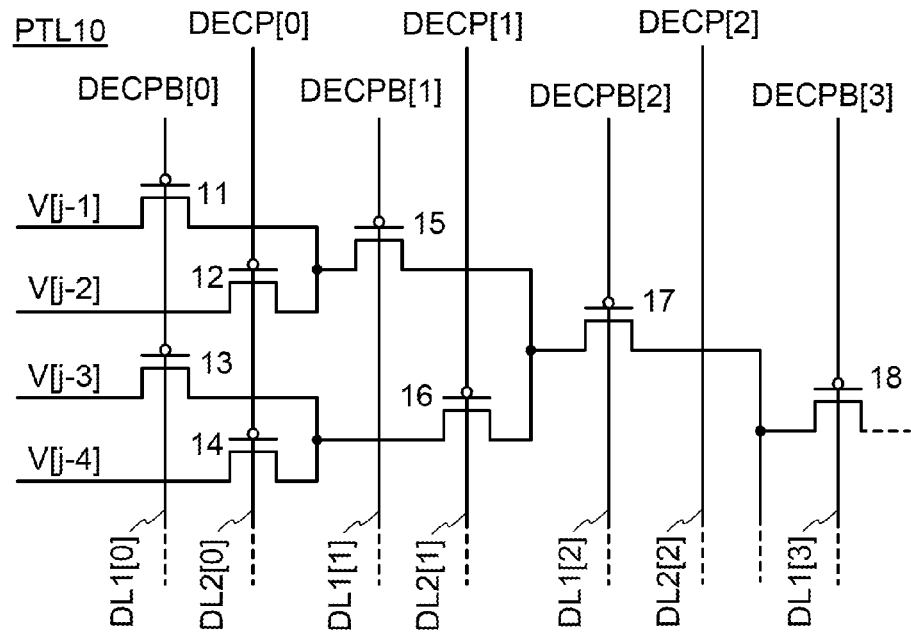
FIGS. 4A and 4B are a circuit diagram and a top view illustrating one embodiment of the present invention.

FIG. 4A illustrates part of the circuit diagram of the PTL 10 in FIG. 1 and assigns reference numerals 11 to 18 to transistors.

Figure 4B:
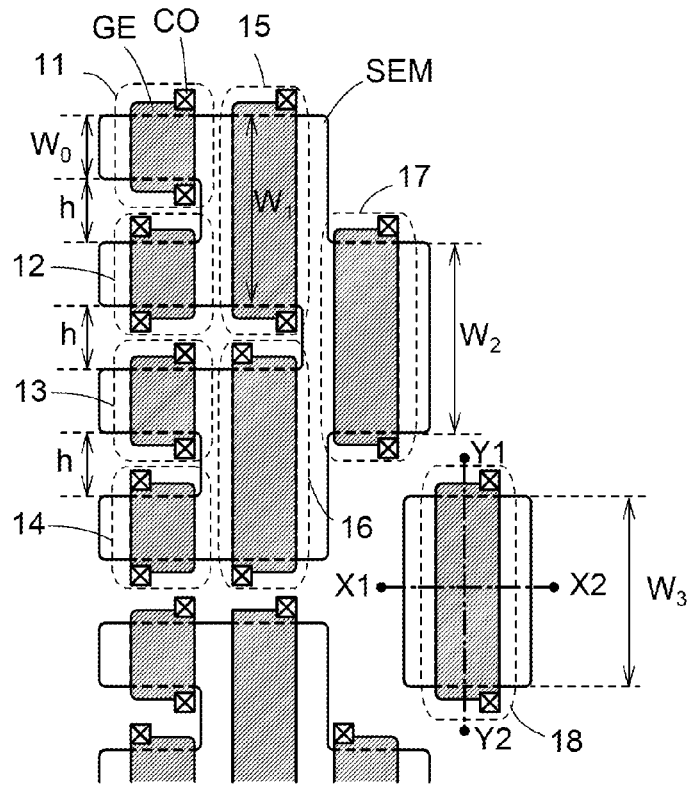

FIG. 4B illustrates an example of a top view corresponding to the circuit diagram in FIG. 4A. In the top view of FIG. 4B, some components are enlarged, reduced in size, or omitted for easy understanding.

Note that FIGS. 4A and 4B show part of the circuit composed of p-channel transistors on the high voltage side in the circuit diagram of FIG. 1; however, the following description also applies to the case where the circuit in FIGS. 4A and 4B is the circuit composed of n-channel transistors on the low voltage side.

In the top view of FIG. 4B, the transistors 11 to 18 each include a semiconductor SEM, a gate GE, and a contact CO. In the semiconductor SEM, a region overlapped by the gate GE has a function of a channel, and regions that are not overlapped by the gate GE have functions of a source and a drain. The resistance of the source and the drain is preferably lowered by impurity addition.

In the PTL 10, a wiring and the like are formed above the semiconductor SEM and the gate GE so that the circuit in FIG. 4A is completed; however, they are omitted in FIG. 4B for clarification. The symbols GE, SEM, and CO are given to some of the transistors, and common hatching patterns are used as alternatives to the symbols for the other transistors.

In FIGS. 4A and 4B, a gate of the transistor 11 is electrically connected to a wiring DL1[0] through the contact CO and receives the signal DECPB[0]. One of a source and a drain of the transistor 11 is supplied with the voltage V[j−1]. The other of the source and the drain of the transistor 11 is electrically connected to one of a source and a drain of the transistor 15.

In FIGS. 4A and 4B, a gate of the transistor 12 is electrically connected to a wiring DL2[0] through the contact CO and receives the signal DECP[0]. One of a source and a drain of the transistor 12 is supplied with the voltage V[j−2]. The other of the source and the drain of the transistor 12 is electrically connected to the one of the source and the drain of the transistor 15.

In FIGS. 4A and 4B, a gate of the transistor 13 is electrically connected to the wiring DL1[0] through the contact CO and receives the signal DECPB[0]. One of a source and a drain of the transistor 13 is supplied with the voltage V[j−3]. The other of the source and the drain of the transistor 13 is electrically connected to one of a source and a drain of the transistor 16.

In FIGS. 4A and 4B, a gate of the transistor 14 is electrically connected to the wiring DL2[0] through the contact CO and receives the signal DECP[0]. One of a source and a drain of the transistor 14 is supplied with the voltage V[j−4]. The other of the source and the drain of the transistor 14 is electrically connected to the one of the source and the drain of the transistor 16.

In FIGS. 4A and 4B, a gate of the transistor 15 is electrically connected to a wiring DL1[1] through the contact CO and receives the signal DECPB[1]. The other of the source and the drain of the transistor 15 is electrically connected to one of a source and a drain of the transistor 17.

In FIGS. 4A and 4B, a gate of the transistor 16 is electrically connected to a wiring DL2[1] through the contact CO and receives the signal DECP[1]. The other of the source and the drain of the transistor 16 is electrically connected to the one of the source and the drain of the transistor 17.

In FIGS. 4A and 4B, a gate of the transistor 17 is electrically connected to a wiring DL1[2] through the contact CO and receives the signal DECPB[2]. The other of the source and the drain of the transistor 17 is electrically connected to one of a source and a drain of the transistor 18 through a wiring (not illustrated) provided in an upper layer so that the connection relation in FIG. 4A is satisfied.

In FIGS. 4A and 4B, a gate of the transistor 18 is electrically connected to a wiring DL1[3] through the contact CO and receives the signal DECPB[3].

The transistors 11 to 14 are preferably arranged in a line in the channel width direction as illustrated in FIG. 4B. That is, in the PTL 10 of FIG. 1, the transistors $P_1[0]$, $P_2[0]$, $N_1[0]$, and $N_2[0]$ are preferably arranged in a line in the channel width direction. Providing the transistors in such a manner enables downsized transistors to be arranged in a smaller area in the channel width direction.

Note that in FIG. 4B, the direction represented by dashed-dotted line Y1-Y2 is the channel width direction, and the direction represented by dashed-dotted line X1-X2 is the channel length direction.

Here, in FIG. 4B, the channel width of the transistors 11 to 14 is denoted by $W_0$; that of the transistors 15 and 16, $W_1$; that of the transistor 17, $W_2$; and that of the transistor 18, $W_3$.

In FIG. 1, the channel width of the transistors $P_1[0]$, $P_2[0]$, $N_1[0]$, and $N_2[0]$ is denoted by $W_0$; that of the transistors $P_1[1]$, $P_2[1]$, $N_1[1]$, and $N_2[1]$, $W_1$; that of the transistors $P_1[k-2]$, $P_2[k-2]$, $N_1[k-2]$, and $N_2[k-2]$, $W_{k-2}$; and that of the transistors $P_1[k-1]$ and $N_1[k-1]$, $W_{k-1}$.

As illustrated in FIG. 4B, the channel width $W_0$ is preferably smaller than the channel widths $W_1$ to $W_3$. Similarly, in FIG. 1, the channel width $W_0$ is preferably smaller than the channel widths $W_1$ to $W_{k-1}$.

Note that a channel width refers to, for example, the length of a portion where the source and the drain face each other in a region where the semiconductor SEM (or a portion where a current flows in the semiconductor SEM when the transistor is on) and the gate GE overlap each other, or in a region where a channel is formed. In one transistor, channel widths in all regions are not necessarily the same. That is, the channel width of one transistor is not limited to one value in some cases. Therefore, in this specification, a channel width is any one of widths, the maximum width, the minimum width, or the average width of a region where a channel is formed.

A channel length refers to, for example, a distance between the source and the drain in a region where the semiconductor SEM (or a portion where a current flows in the semiconductor SEM when the transistor is on) and the gate GE overlap each other or a region where a channel is formed in the top view of the transistors 11 to 18. In one transistor, channel lengths in all regions are not necessarily the same. That is, the channel length of one transistor is not limited to one value in some cases. Therefore, in this specification, the channel length is any one of lengths, the maximum length, the minimum length, or the average length of a region where a channel is formed.

It is preferred that transistors of the same conductivity type (n-type or p-type) be provided adjacent to each other as illustrated in FIG. 4B, in which case a source and a drain can be shared between the adjacent transistors in some cases, leading to a reduction in area of the transistors.

For example, when the PTL 10 is applied to a driver IC, higher definition of a display device results in a narrower space between the wirings supplied with the signals DECPB [0] to DECPB[k−1], and accordingly a space (a distance h in FIG. 4B) between the wirings supplied with the voltages V[0] to V[j−1] is also narrowed. As a result, downsizing of transistors is required. In this case, arranging transistors as illustrated in FIG. 4B makes it possible to satisfy the requirement and address the trend toward higher definition of a display device.

A large channel width of the transistors 15 to 18 results in smaller on resistance of these transistors, leading to higher operation speed of the circuit.

In the case of the circuit in FIG. 1, the on resistance $R_{total}$ of the entire PTL 10 can be expressed by Formula 1.

[Formula 1]

$$R_{total} \propto \frac{1}{W_0} + \sum_{n=1}^{k-1} \frac{1}{W_n} \quad (1)$$

The consumed power $P_{total}$ of the entire PTL 10 at this time can be expressed by Formula 2.

[Formula 2]

$$P_{total} \propto 2^k \times W_0 + \sum_{n=1}^{k-1} (2^{k-n} \times W_n) \quad (2)$$

It is clear from Formula 1 that the on resistance $R_{total}$ decreases as the channel width of the transistors included in the PTL 10 is larger. A small on resistance $R_{total}$ is preferable because the operation speed of the circuit can be increased.

In contrast, it is seen from Formula 2 that the consumed power $P_{total}$ increases as the channel width of the transistors included in the PTL 10 is larger. It is thus necessary to set the channel width of the transistors such that both the on resistance $R_{total}$ and the consumed power $P_{total}$ are small.

The channel widths $W_1$ to $W_{k-1}$ are larger than 1 time and smaller than 10 times, preferably larger than 2 times and smaller than 8 times, further preferably larger than 3 times and smaller than 5 times the channel width Wo, for example.

For example, when the on resistance $R_{total}$ of the PTL 10 in FIG. 3 with given CMOS technology is calculated from Formula 1 where $W_0$=1 μm and $W_1$ to $W_{k-1}$=3.3 μm, $R_{total}$ is 107 kΩ.

Next, an example of the shape of the transistor included in the PTL 10 will be described with reference to FIGS. 5A and 5B.

Figure 5A:
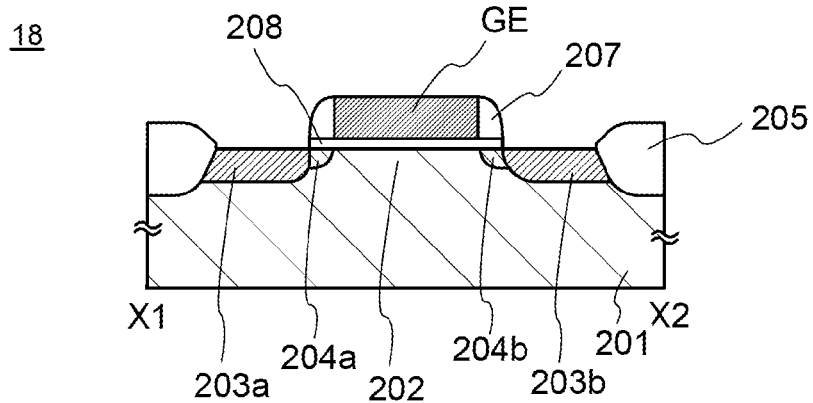
FIGS. 5A and 5B are cross-sectional views of a transistor for illustrating one embodiment of the present invention.

FIG. 5A is a cross-sectional view of the transistor 18 in the direction of the dashed-dotted line X1-X2 in FIG. 4B. FIG. 5B is a cross-sectional view of the transistor 18 in the direction of the dashed-dotted line Y1-Y2 in FIG. 4B. Although the transistor 18 is shown as a p-channel transistor in FIG. 4A, the transistor 18 in FIGS. 5A and 5B is not limited to a p-channel transistor and may be regarded as an n-channel transistor.

The transistor 18 includes a substrate 201, a channel 202, an impurity region 203a, an impurity region 203b, an impurity region 204a, an impurity region 204b, an element isolation layer 205, a sidewall insulating layer 207, an insulating film 208, and the gate GE.

As the substrate 201, a single crystal semiconductor substrate or a polycrystalline semiconductor substrate of silicon or silicon carbide, a compound semiconductor substrate of silicon germanium, a silicon-on-insulator (SOI) substrate, or the like can be used. When a p-type single crystal silicon substrate is used as the substrate 201, an impurity element imparting n-type conductivity may be added to part of the substrate 201 to form an n-well, and a p-type transistor can be formed in a region where the n-well is formed. As the impurity element imparting n-type conductivity, phosphorus (P), arsenic (As), or the like can be used. As an impurity element imparting p-type conductivity, boron (B) or the like may be used.

Alternatively, the substrate 201 may be an insulating substrate over which a semiconductor film is provided. Examples of the insulating substrate are a glass substrate, a quartz substrate, a plastic substrate, a flexible substrate, an attachment film, paper including a fibrous material, and a base film. Examples of a glass substrate include a barium borosilicate glass substrate, an aluminoborosilicate glass substrate, and a soda lime glass substrate. Examples of a flexible substrate include flexible synthetic resin substrates of plastics typified by polyethylene terephthalate (PET), polyethylene naphthalate (PEN), and polyether sulfone (PES), and acrylic. Examples of an attachment film are attachment films formed using polypropylene, polyester, polyvinyl fluoride, and polyvinyl chloride. Examples of a base film are base films formed using polyester, polyamide, polyimide, aramid, epoxy, an inorganic vapor deposition film, and paper.

Alternatively, the substrate 201 may be a metal substrate over which a semiconductor film is provided. Examples of the metal substrate are a stainless steel substrate, a substrate including stainless steel foil, a tungsten substrate, and a substrate including tungsten foil.

Note that a semiconductor element may be formed using one substrate and then transferred to another substrate. Examples of a substrate to which a semiconductor element is transferred are, in addition to the above-described substrates, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or with low power consumption can be formed, a device with high durability or high heat resistance can be provided, or reduction in weight or thickness can be achieved.

The transistor 18 is isolated from other transistors formed on the substrate 201 by the element isolation layer 205. The element isolation layer 205 can be formed using an insulator containing one or more materials selected from aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like.

The element isolation layer 205 may be formed with local oxidation of silicon (LOCOS) or shallow trench isolation (STI).

The impurity regions 203a and 203b are regions whose resistance is lowered by impurity addition and have functions of a source and a drain.

The impurity regions 204a and 204b functioning as a lightly doped drain (LDD) region or an extension region may be provided below the sidewall insulating layer 207. In particular, when the transistor 18 is an n-channel transistor, the LDD region or the extension region is preferably provided in order to suppress the deterioration due to hot carriers.

As the transistor 18, a transistor containing silicide (salicide) or a transistor that does not include the sidewall insulating layer 207 may be used. With a structure using silicide (salicide), the resistance of the source and the drain can be further lowered and the operation speed of a semiconductor device can be increased. Furthermore, the transistor containing silicide (salicide) can operate at low voltage; thus, power consumption of the semiconductor device can be reduced.

The insulating film 208 functions as a gate insulating film. The insulating film 208 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating film 208 may be a stacked layer including any of the above materials. The insulating film 208 may contain lanthanum (La), nitrogen, zirconium (Zr), or the like as an impurity.

In particular, the insulating film 208 preferably contains oxygen, nitrogen, silicon, hafnium, or the like. Specifically, the insulating film 208 preferably includes hafnium oxide and silicon oxide or silicon oxynitride.

The gate GE is formed using an element selected from tantalum (Ta), tungsten (W), titanium (Ti), molybdenum (Mo), aluminum (Al), copper (Cu), chromium (Cr), niobium (Nb), and the like, or an alloy material or a compound material containing any of the above elements as its main component (e.g., tantalum nitride). Alternatively, the gate GE may be formed using a semiconductor material typified by polycrystalline silicon doped with an impurity element such as phosphorus or boron.

Figure 6:
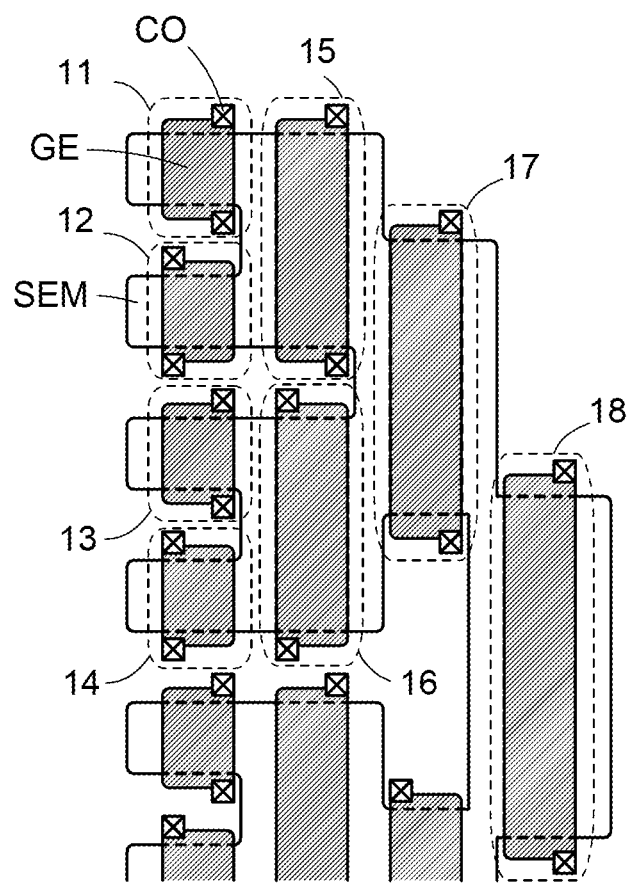
FIG. 6 is a top view illustrating one embodiment of the present invention.

FIG. 6 is a top view illustrating the case where the channel width of the transistor 17 is larger than that of the transistors 15 and 16 and the channel width of the transistor 18 is larger than that of the transistor 17 in FIG. 4B.

As illustrated in FIG. 6, the transistors may be arranged in ascending order of channel width from the left to right columns. Arranging the transistors in such a manner reduces the on resistance of the entire PTL 10 and can increase the operation speed of the circuit.

The transistors included in the PTL 10 can be arranged in a manner other than the above.

For example, in the top view of FIG. 4B, the channel width of the transistors 15 and 16 may be made equal to that of the transistors 11 to 14.

As another example, in the top view of FIG. 6, the channel width of the transistors 15 and 16 may be made equal to that of the transistors 11 to 14.

Transistor Arrangement Example 2

The above example shows the case using a planar transistor. The case using a FIN transistor will be described below.

Figure 7A:
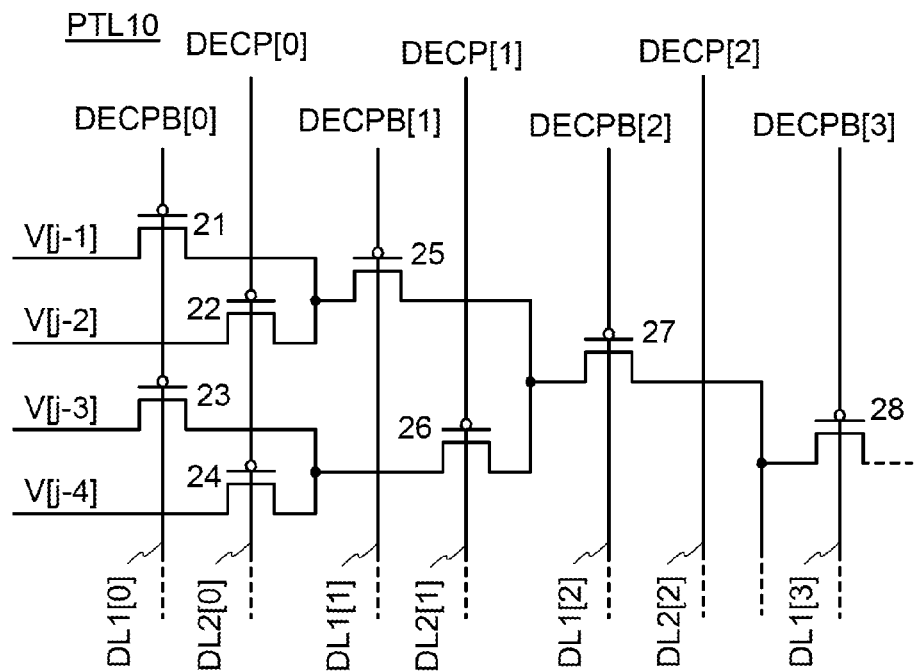
FIGS. 7A and 7B are a circuit diagram and a top view illustrating one embodiment of the present invention.

FIG. 7A illustrates part of the circuit diagram of the PTL 10 in FIG. 1 and assigns reference numerals 21 to 28 to the transistors $P_1[0]$ to $P_1[3]$ and the transistors $P_2[0]$ to $P_2[1]$.

Figure 7B:
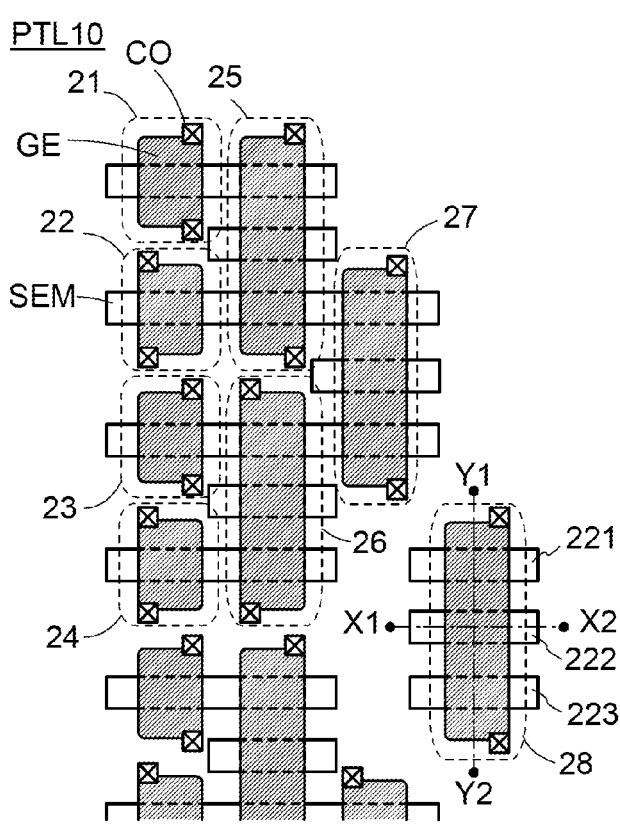

FIG. 7B illustrates a top view corresponding to the circuit diagram in FIG. 7A. In the top view of FIG. 7B, some components are enlarged, reduced in size, or omitted for easy understanding.

Note that FIGS. 7A and 7B show part of the circuit composed of p-channel transistors on the high voltage side in the circuit diagram of FIG. 1; however, the following description also applies to the case where the circuit in FIGS. 7A and 7B is the circuit composed of n-channel transistors on the low voltage side.

In the top view of FIG. 7B, the transistors 21 to 28 each include the semiconductor SEM, the gate GE, and the contact CO. In the semiconductor SEM, a region overlapped by the gate GE has a function of a channel, and regions that are not overlapped by the gate GE have functions of a source and a drain. The resistance of the source and the drain is preferably lowered by impurity addition.

In the PTL 10, a wiring and the like are formed above the semiconductor SEM and the gate GE so that the circuit in FIG. 7A is completed; however, they are omitted in FIG. 7B for clarification. The symbols GE, SEM, and CO are given to some of the transistors, and common hatching patterns are used as alternatives to the symbols for the other transistors.

In FIGS. 7A and 7B, a gate of the transistor 21 is electrically connected to the wiring DL1[0] through the contact CO and receives the signal DECPB[0]. One of a source and a drain of the transistor 21 is supplied with the voltage V[j−1]. The other of the source and the drain of the transistor 21 is electrically connected to one of a source and a drain of the transistor 25.

In FIGS. 7A and 7B, a gate of the transistor 22 is electrically connected to the wiring DL2[0] through the contact CO and receives the signal DECP[0]. One of a source and a drain of the transistor 22 is supplied with the voltage V[j−2]. The other of the source and the drain of the transistor 22 is electrically connected to the one of the source and the drain of the transistor 25.

In FIGS. 7A and 7B, a gate of the transistor 23 is electrically connected to the wiring DL1[0] through the contact CO and receives the signal DECPB[0]. One of a source and a drain of the transistor 23 is supplied with the voltage V[j−3]. The other of the source and the drain of the transistor 23 is electrically connected to one of a source and a drain of the transistor 26.

In FIGS. 7A and 7B, a gate of the transistor 24 is electrically connected to the wiring DL2[0] through the contact CO and receives the signal DECP[0]. One of a source and a drain of the transistor 24 is supplied with the voltage V[j−4]. The other of the source and the drain of the transistor 24 is electrically connected to the one of the source and the drain of the transistor 26.

In FIGS. 7A and 7B, a gate of the transistor 25 is electrically connected to the wiring DL1[1] through the contact CO and receives the signal DECPB[1]. The other of the source and the drain of the transistor 25 is electrically connected to one of a source and a drain of the transistor 27.

In FIGS. 7A and 7B, a gate of the transistor 26 is electrically connected to the wiring DL2 [1] through the contact CO and receives the signal DECP[1]. The other of the source and the drain of the transistor 26 is electrically connected to the one of the source and the drain of the transistor 27.

In FIGS. 7A and 7B, a gate of the transistor 27 is electrically connected to the wiring DL1[2] through the contact CO and receives the signal DECPB[2]. The other of the source and the drain of the transistor 27 is electrically connected to one of a source and a drain of the transistor 28 through a wiring (not illustrated) provided in an upper layer.

In FIGS. 7A and 7B, a gate of the transistor 28 is electrically connected to the wiring DL1[3] through the contact CO and receives the signal DECPB[3].

Next, the shape of the transistor included in the PTL 10 of FIGS. 7A and 7B will be described with reference to FIGS. 8A and 8B.

Figure 8A:
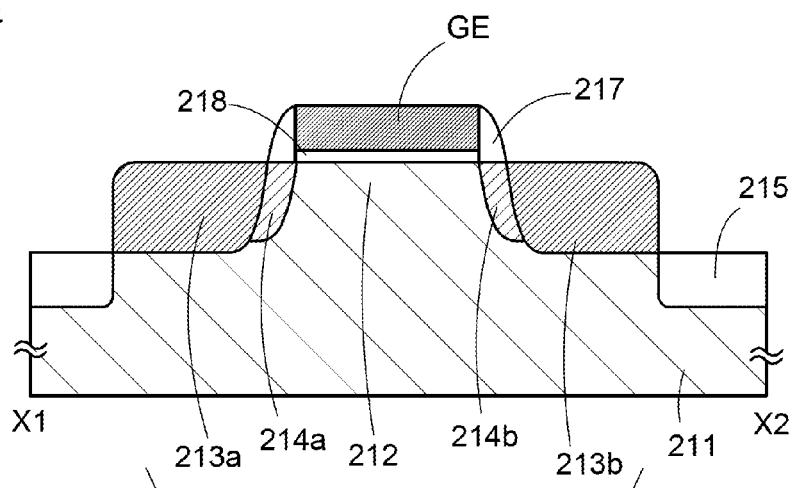
FIGS. 8A and 8B are cross-sectional views of a transistor for illustrating one embodiment of the present invention.

FIG. 8A is a cross-sectional view of the transistor 28 in the direction of the dashed-dotted line X1-X2 in FIG. 7B. FIG. 8B is a cross-sectional view of the transistor 28 in the direction of the dashed-dotted line Y1-Y2 in FIG. 7B. Although the transistor 28 is shown as a p-channel transistor in FIG. 7A, the transistor 28 in FIGS. 8A and 8B is not limited to a p-channel transistor and may be regarded as an n-channel transistor.

The transistor 28 includes a substrate 211, a channel 212, an impurity region 213a, an impurity region 213b, an impurity region 214a, an impurity region 214b, an element isolation layer 215, a sidewall insulating layer 217, an insulating film 218, and the gate GE.

Figure 8B:
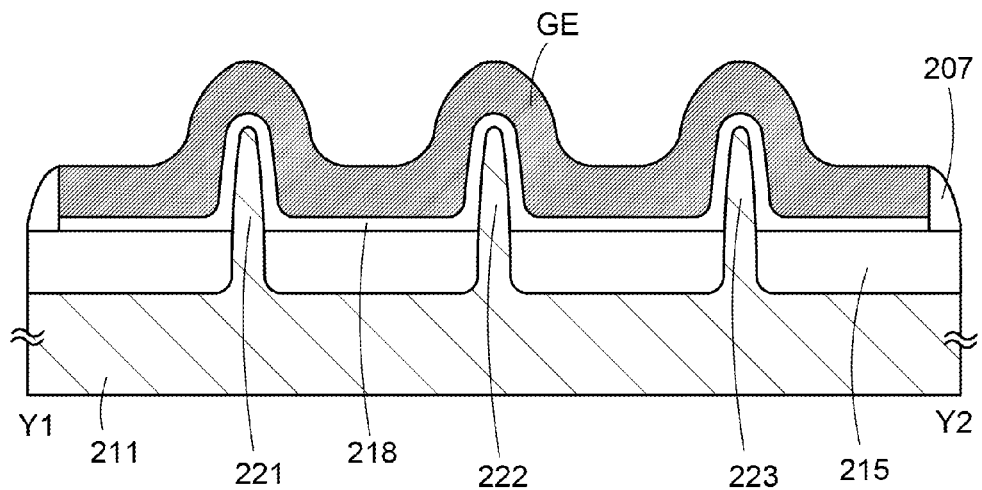

The transistor 28 also includes semiconductors 221, 222, and 223 having a protruding shape (see FIG. 7B and FIG. 8B). The insulating film 218 and the gate GE are provided along side surfaces and top surfaces of the semiconductors 221 to 223. Such a transistor is referred to as a FIN transistor. Note that an insulating film serving as a mask for forming the protruding portion may be provided in contact with the upper part of the protruding portion. Although the case where the protruding portion is formed by processing part of the substrate 211 is described here, a semiconductor layer having a protruding shape may be formed by processing an SOI substrate.

Figure 5B:
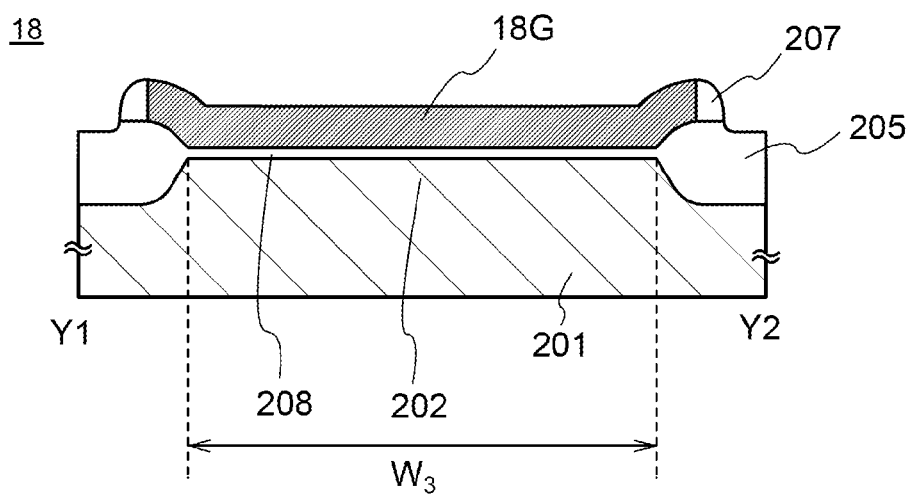

The description of the substrate 201 in FIGS. 5A and 5B is referred to for the details of the substrate 211.

The description of the impurity regions 203a and 203b in FIGS. 5A and 5B is referred to for the details of the impurity regions 213a and 213b.

The description of the impurity regions 204a and 204b in FIGS. 5A and 5B is referred to for the details of the impurity regions 214a and 214b.

The description of the element isolation layer 205 in FIGS. 5A and 5B is referred to for the details of the element isolation layer 215.

The description of the insulating film 208 in FIGS. 5A and 5B is referred to for the details of the insulating film 218.

The description of the sidewall insulating layer 207 in FIGS. 5A and 5B is referred to for the details of the sidewall insulating layer 217.

In the FIN transistor illustrated in FIGS. 8A and 8B, the side surfaces of the semiconductors 221 to 223 are surrounded by the gate GE. This structure enables a gate electric field to be applied to the semiconductors 221 to 223 effectively and prevents short-channel effects such as drain induced barrier lowering (DIBL). Furthermore, a channel is formed also on the side surfaces of the semiconductors 221 to 223, so that a current of the transistor in the on state (on-state current) can be increased. The FIN structure is suitable for a downsized transistor.

The transistors 21 to 24 are preferably arranged in a line in the channel width direction as illustrated in FIG. 7B. That is, in the PTL 10 of FIG. 1, the transistors $P_1[0]$, $P_2[0]$, $N_1[0]$, and $N_2[0]$ are preferably arranged in a line in the channel width direction. Providing the transistors in such a manner enables downsized transistors to be arranged in a smaller area in the channel width direction.

Note that in FIG. 7B, the direction represented by dashed-dotted line Y1-Y2 is the channel width direction, and the direction represented by dashed-dotted line X1-X2 is the channel length direction.

In the top view of FIG. 7B, the transistors 21 to 27 each include at least one semiconductor SEM having a protruding shape. For example, the transistors 21 to 24 each include one semiconductor SEM, and the transistors 25 to 28 each include three semiconductors SEM.

Here, in FIG. 7B, the number of semiconductors SEM in the transistors 21 to 24 is denoted by $NM_0$; that in the transistors 25 and 26, $NM_1$; that in the transistor 27, $NM_2$; and that in the transistor 28, $NM_3$.

Furthermore, in FIG. 1, the number of semiconductors SEM in the transistors $P_1[0]$, $P_2[0]$, $N_1[0]$, and $N_2[0]$ is denoted by NMo; that in the transistors $P_1[1]$, $P_2[1]$, $N_1[1]$, and $N_2[1]$, $NM_1$; that in the transistors $P_1[k-2]$, $P_2[k-2]$, $N_1[k-2]$, and $N_2[k-2]$, $NM_{k-2}$; and that in the transistors $P_1[k-1]$ and $N_1[k-1]$, $NM_{k-1}$.

As illustrated in FIG. 7B, the number $NM_0$ is preferably smaller than the numbers $NM_1$ to $NM_3$. Similarly, in FIG. 1, the number $NM_0$ is preferably smaller than the numbers $NM_1$ to $NM_{k-1}$.

It is preferred that transistors of the same conductivity type (n-type or p-type) be provided adjacent to each other as illustrated in FIG. 7B, in which case a source and a drain can be shared between the adjacent transistors in some cases, leading to a reduction in area of the transistors.

For example, when the PTL 10 is applied to a driver IC, higher definition of a display device results in a narrower space between the wirings supplied with the signals DECPB[0] to DECPB[k-1], and accordingly a space between the wirings supplied with the voltages V[0] to V[j-1] is also narrowed. In this case, arranging transistors as illustrated in FIG. 7B makes it possible to satisfy the requirement and address the trend toward higher definition of a display device.

A large channel width of the transistors 25 to 28 results in smaller on resistance of these transistors, leading to higher operation speed of the circuit.

Figure 9:
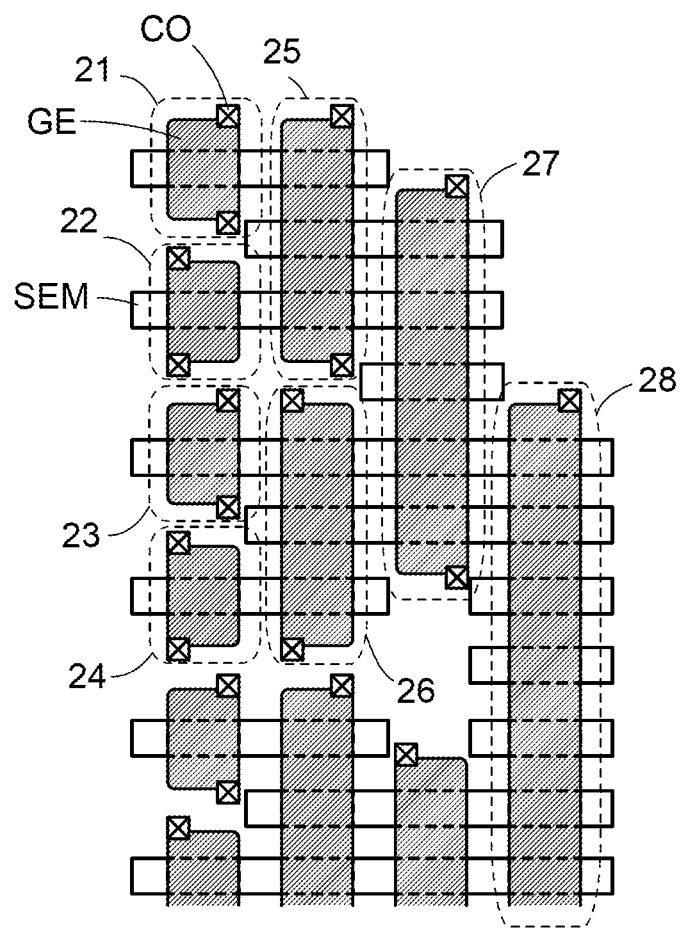
FIG. 9 is a top view illustrating one embodiment of the present invention.

FIG. 9 is a top view illustrating the case where the number of semiconductors SEM in the transistor 27 is increased to five and that in the transistor 28 is increased to seven in FIG. 7B.

As illustrated in FIG. 9, the number of semiconductors SEM in the transistors may be increased from the left to right columns Arranging the transistors in such a manner reduces the on resistance of the entire PTL 10 and can increase the operation speed of the circuit.

The transistors included in the PTL 10 can be arranged in a manner other than the above.

For example, in the top view of FIG. 7B, the number of semiconductors SEM in the transistors 25 and 26 may be made equal to that in the transistors 21 to 24.

For example, in the top view of FIG. 9, the number of semiconductors SEM in the transistors 25 and 26 may be made equal to that in the transistors 21 to 24.

PTL Configuration Example 2

Figure 10:
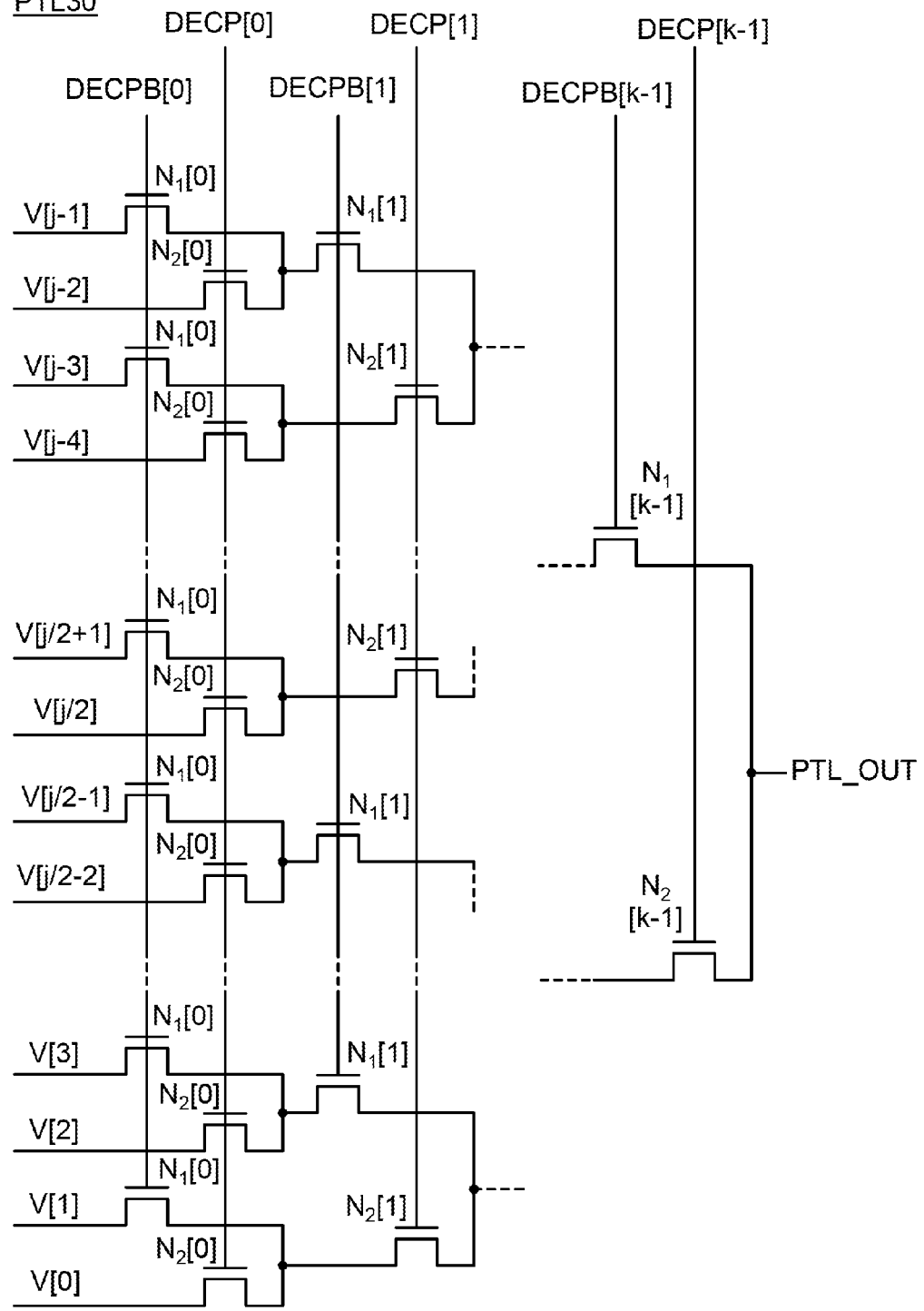
FIG. 10 is a circuit diagram illustrating one embodiment of the present invention.

FIG. 10 illustrates a circuit configuration of a PTL 30 that is different from the PTL 10.

The PTL 30 in FIG. 10 is the PTL 10 of FIG. 1 in which all the p-channel transistors are replaced with n-channel transistors.

The n-channel transistors are preferably transistors containing an oxide semiconductor in their channels (oxide semiconductor transistors). An oxide semiconductor transistor exhibits extremely low leakage current in the off state (off-state current) and can form a circuit with low power consumption.

The oxide semiconductor is an oxide semiconductor containing indium (In), for example. The oxide semiconductor has high carrier mobility (electron mobility) by containing indium, for example. Moreover, the oxide semiconductor preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M. The element M is an element having a high bonding energy with oxygen, for example. For instance, the element M is an element whose bonding energy with oxygen is higher than that of indium or an element that can increase the energy gap of the oxide semiconductor. Furthermore, the oxide semiconductor preferably contains zinc (Zn). The oxide semiconductor containing zinc is easily crystallized in some cases.

Note that the oxide semiconductor is not limited to an oxide semiconductor containing indium. The oxide semiconductor may be, for example, an oxide semiconductor that contains zinc, gallium, or tin and no indium (e.g., zinc tin oxide or gallium tin oxide).

Any of the arrangement and structure examples of the transistors illustrated in FIGS. 4A and 4B, FIGS. 5A and 5B, FIG. 6, FIGS. 7A and 7B, FIGS. 8A and 8B, and FIG. 9 can be applied to the PTL 30 in FIG. 10.

Embodiment 2

Figure 11:
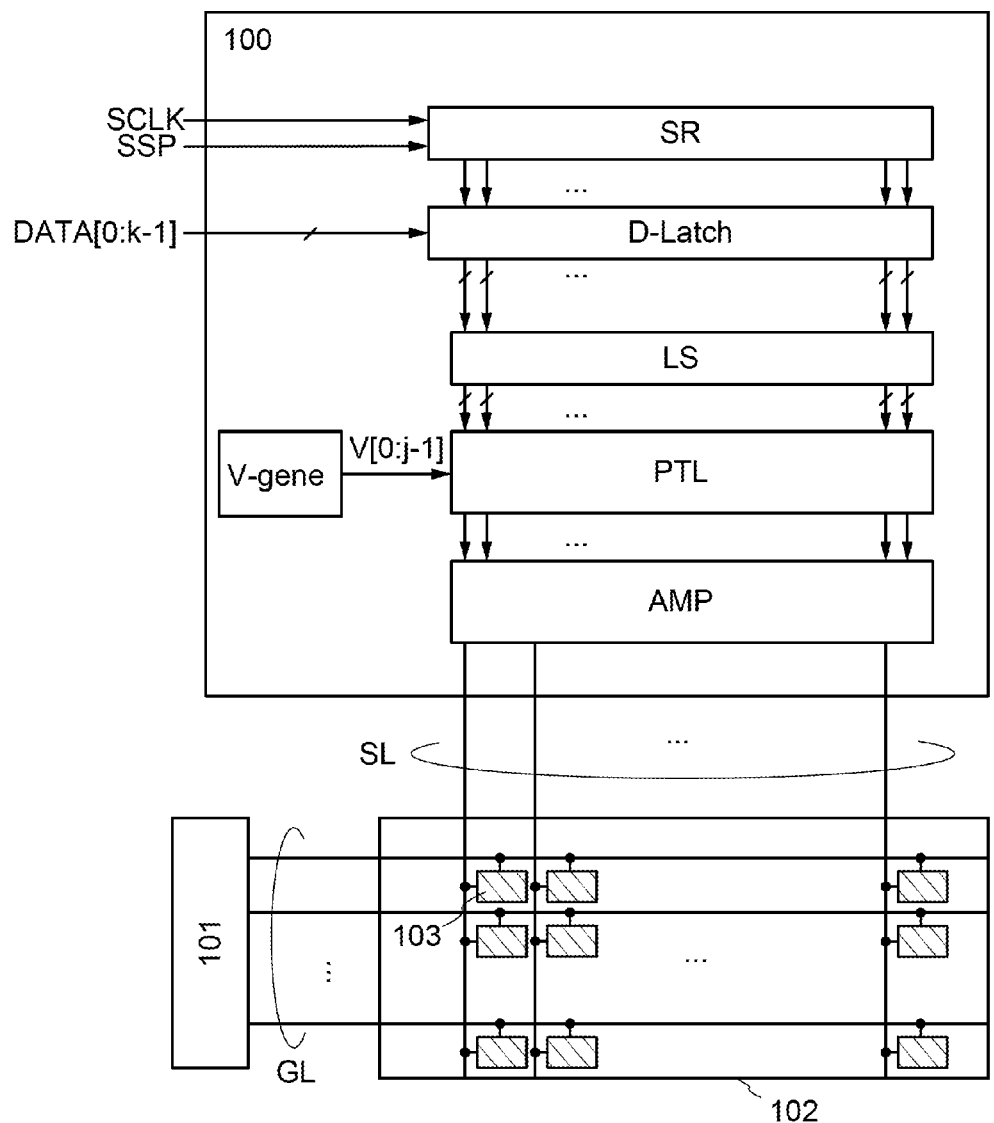
FIG. 11 is a circuit block diagram illustrating a configuration example of a display device.

This embodiment will explain a circuit block diagram of a display device including a level shifter LS, a pass transistor logic PTL, and an amplifier AMP. FIG. 11 is a circuit block diagram illustrating a source driver, a gate driver, and a display portion.

The display device in the circuit block diagram of FIG. 11 includes a source driver 100, a gate driver 101, and a display portion 102. In the display portion 102 of FIG. 11, pixels 103 are arranged in a matrix.

The source driver 100 includes a shift register SR, a data latch D-Latch, the level shifter LS, the pass transistor logic PTL, the voltage generator circuit V-gene, and the amplifier AMP. The source driver 100 has a function of outputting analog image data to a plurality of source lines SL. The source driver 100 may consist of a driver IC.

A source clock SCLK and a source start pulse SSP, for example, are input to the shift register SR. The shift register SR generates a sampling pulse and outputs it to the data latch D-Latch.

In addition to the sampling pulse, data signals DATA[0] to DATA[k−1] that are digital image data are input to the data latch D-Latch. The data signals DATA[0] to DATA[k−1] are latched into the data latch D-Latch in response to the sampling pulse. The data latch D-Latch outputs the latched data signals DATA[0] to DATA[k−1] to the level shifter LS.

The level shifter LS boosts the input data signals DATA[0] to DATA[k−1] to the signals DECPB[0] to DECPB[k−1] shown in Embodiment 1 and outputs the signals DECPB[0] to DECPB[k−1].

The pass transistor logic PTL is as described in Embodiment 1. Specifically, the pass transistor logic PTL controls the on/off state of the transistors in accordance with the signals DECPB[0] to DECPB[k−1] obtained by boosting and outputs an output signal PTL_OUT that is an analog signal corresponding to the voltages V[0] to V[j−1] generated in the voltage generator circuit V-gene. The PTL 10 or the PTL 30 shown in Embodiment 1 may be used for the pass transistor logic PTL.

The amplifier AMP increases the current of the output signal PTL_OUT input thereto and outputs the resulting signal as a data signal Vdata.

The data signals Vdata obtained in the amplifier AMP are analog signals output to the source lines SL.

The gate driver 101 includes a shift register and a buffer, for example. The gate driver 101 receives a gate start pulse, a gate clock signal, and the like and outputs a pulse signal. A circuit included in the gate driver 101 may be an IC as in the source driver 100 or may be formed using a transistor similar to that in the pixel 103 of the display portion 102.

The gate driver 101 outputs scan signals to a plurality of gate lines GL. Note that a plurality of gate drivers 101 may be provided to separately control the gate lines GL.

In the display portion 102, the gate lines GL and the source lines SL are provided to intersect at substantially right angles. The pixel 103 is provided at the intersection of the gate line GL and the source line SL. For color display, the pixels 103 corresponding to the respective colors of red, green, and blue (RGB) are arranged in sequence in the display portion 102. Note that the pixels of RGB can be arranged in a stripe pattern, a mosaic pattern, a delta pattern, or the like as appropriate. Without limitation to RGB, white, yellow, or the like may be added to RGB for color display.

Figure 12A:
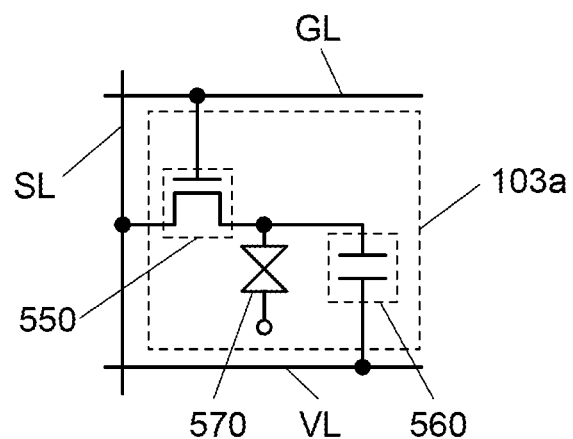
FIGS. 12A and 12B are circuit diagrams each illustrating a configuration example of a pixel.

The pixel 103 in FIG. 11 can have a configuration illustrated in FIG. 12A, for example.

A pixel circuit 103a illustrated in FIG. 12A includes a liquid crystal element 570, a transistor 550, and a capacitor 560.

The potential of one of a pair of electrodes of the liquid crystal element 570 is set as appropriate according to the specifications of the pixel circuit 103a. The alignment of liquid crystal molecules in the liquid crystal element 570 depends on written data. A common potential may be supplied to one of the pair of electrodes of the liquid crystal element 570 included in a plurality of pixel circuits 103a. Alternatively, a potential supplied to one of the pair of electrodes of the liquid crystal element 570 in the pixel circuit 103a may be different between rows.

Examples of a driving method of the display device including the liquid crystal element 570 are a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the driving method of the display device include an electrically controlled birefringence (ECB) mode, a polymer dispersed liquid crystal (PDLC) mode, a polymer network liquid crystal (PNLC) mode, and a guest-host mode. Note that one embodiment of the present invention is not limited to the above, and various liquid crystal elements and driving methods can be employed.

In the pixel circuit 103a, one of a source electrode and a drain electrode of the transistor 550 is electrically connected to the source line SL, and the other is electrically connected to the other of the pair of electrodes of the liquid crystal element 570. A gate electrode of the transistor 550 is electrically connected to the gate line GL. The transistor 550 has a function of controlling writing of image data by being turned on or off.

One of a pair of electrodes of the capacitor 560 is electrically connected to a wiring supplied with a potential (hereinafter referred to as potential supply line VL), and the other is electrically connected to the other of the pair of electrodes of the liquid crystal element 570. The potential of the potential supply line VL is set as appropriate according to the specifications of the pixel circuit 103a. The capacitor 560 functions as a storage capacitor for storing written data.

For example, in the display device including the pixel circuit 103a in FIG. 12A, the pixel circuits 103a are sequentially selected row by row by the gate driver 101 illustrated in FIG. 11, whereby the transistor 550 is turned on and image data is written.

When the transistor 550 is turned off, the pixel circuit 103a to which the data has been written is brought into a holding state. This operation is sequentially performed row by row; thus, an image can be displayed.

Figure 12B:
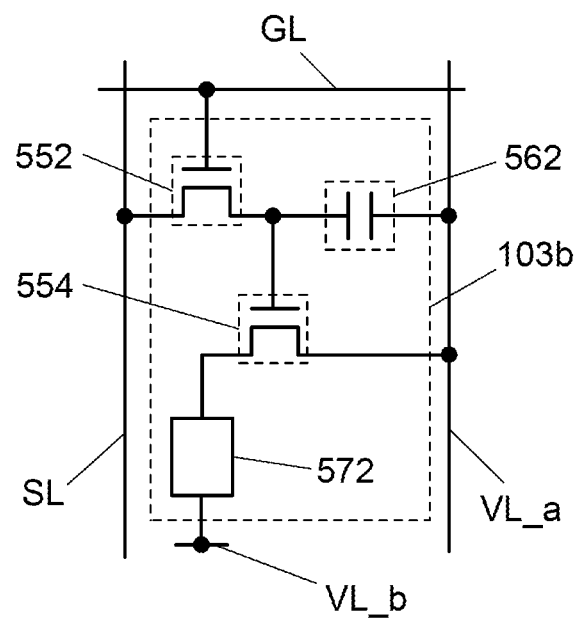

The pixel 103 in FIG. 11 can have a configuration illustrated in FIG. 12B, for example.

A pixel circuit 103b illustrated in FIG. 12B includes transistors 552 and 554, a capacitor 562, and a light-emitting element 572.

In the pixel circuit 103b, one of a source electrode and a drain electrode of the transistor 552 is electrically connected to the source line SL. A gate electrode of the transistor 552 is electrically connected to the gate line GL.

The transistor 552 has a function of controlling writing of image data by being turned on or off.

One of a pair of electrodes of the capacitor 562 is electrically connected to a wiring supplied with a potential (hereinafter referred to as potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as organic EL element) can be used, for example. Note that the light-emitting element 572 is not limited to an organic EL element; an inorganic EL element containing an inorganic material may be used.

A high power supply potential VDD is supplied to one of the potential supply line VL_a and the potential supply line VL_b, and a low power supply potential VSS is supplied to the other.

For example, in the display device including the pixel circuit 103b in FIG. 12B, the pixel circuits 103b are sequentially selected row by row by the gate driver 101 illustrated in FIG. 11, whereby the transistor 552 is turned on and image data is written.

When the transistor 552 is turned off, the pixel circuit 103b to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The pixel circuit 103b may be connected to an external compensation circuit in order to compensate for variation in the threshold voltage of the transistor connected to the light-emitting element. An example of this case is illustrated in FIGS. 13 and 14.

Figure 13:
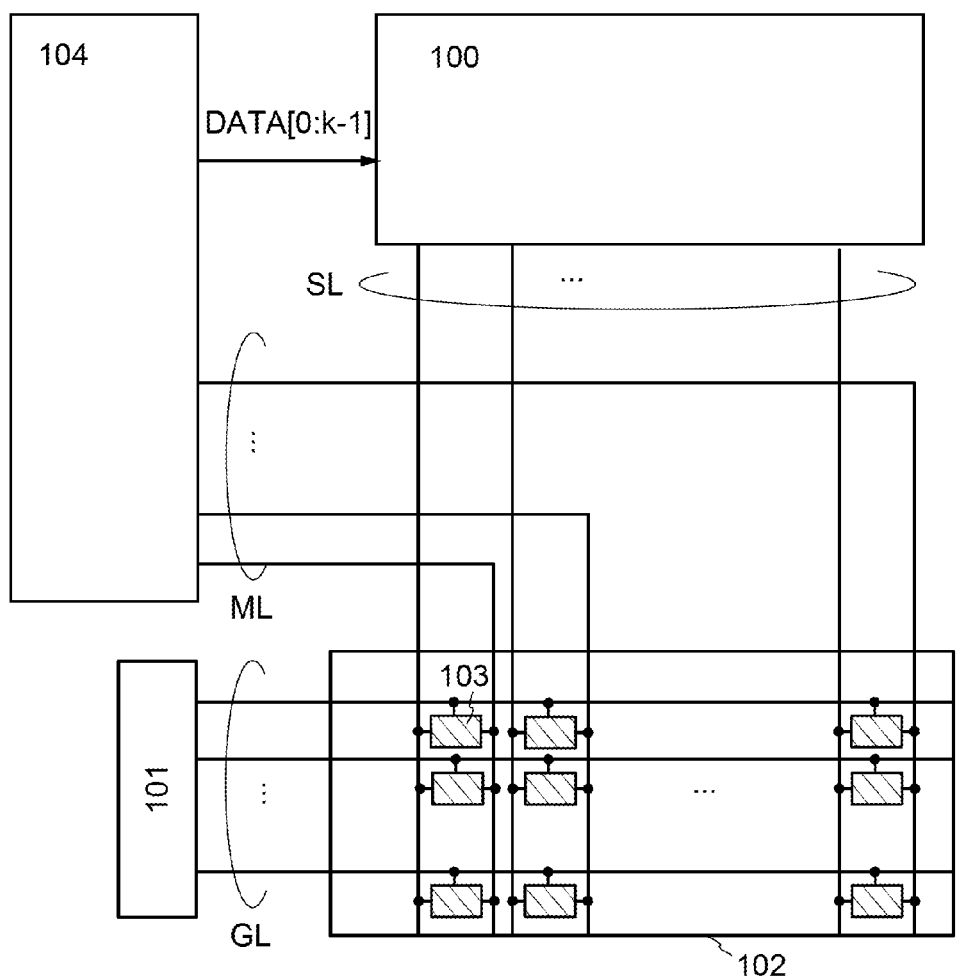
FIG. 13 is a circuit block diagram illustrating a configuration example of a display device.
Figure 14:
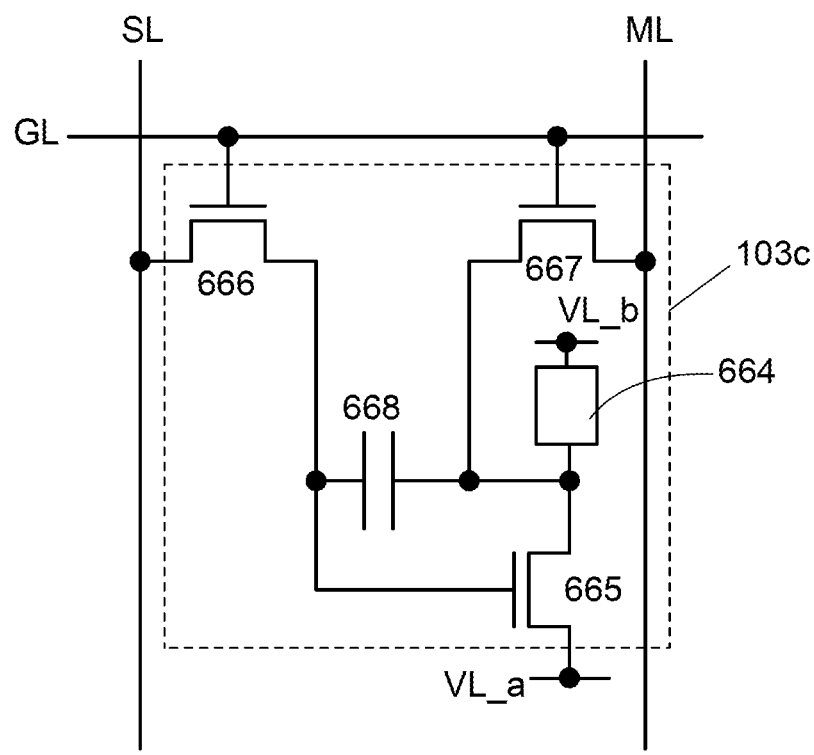
FIG. 14 is a circuit diagram illustrating a configuration example of a pixel.

In FIG. 13, a compensation circuit 104 and a plurality of wirings ML are added to the circuit block diagram of the display device in FIG. 11.

Current flowing through the light-emitting elements in the pixels 103 is supplied to the compensation circuit 104 through the wirings ML.

The compensation circuit 104 includes circuits such as a current detection circuit, memory, an image processing circuit, and a CPU, for example.

The compensation circuit 104 has a function of monitoring a current of the light-emitting element supplied from the pixel 103 and compensating for the data signals DATA[0] to DATA[k−1] input to the source driver 100.

Note that the compensation circuit 104 and the source driver 100 may be included in one driver IC.

The pixel 103 in FIG. 13 can have a configuration illustrated in FIG. 14, for example.

A pixel circuit 103c illustrated in FIG. 14 includes transistors 665 to 667, a capacitor 668, and a light-emitting element 664.

In the pixel circuit 103c, the transistor 666 has a function of controlling electrical continuity between the source line SL and a gate of the transistor 665. One of a source and a drain of the transistor 665 is electrically connected to one of an anode and a cathode of the light-emitting element 664, and the other is electrically connected to the potential supply line VL_a. The transistor 667 has a function of controlling electrical continuity between the wiring ML and the one of the source and the drain of the transistor 665. One of a pair of electrodes of the capacitor 668 is electrically connected to the gate of the transistor 665, and the other is electrically connected to the one of the anode and the cathode of the light-emitting element 664. The other of the anode and the cathode of the light-emitting element 664 is electrically connected to the potential supply line VL_b.

The transistors 666 and 667 are switched in accordance with the potential of the gate line GL.

The description of the light-emitting element 572 in FIG. 12B is referred to for the details of the light-emitting element 664.

A current flowing through the light-emitting element 664 is supplied to the compensation circuit 104 through the transistor 667 and the wiring ML. The compensation circuit 104 monitors the current value and compensates for the data signals DATA[0] to DATA[k−1] supplied to the source driver 100.

For example, in this specification and the like, a display element, a display device including a display element, a light-emitting element, and a light-emitting device including a light-emitting element can employ a variety of modes or can include a variety of elements. A display element, a display device, a light-emitting element, or a light-emitting device includes, for example, at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above elements, a display medium whose contrast, luminance, reflectivity, transmittance, or the like is changed by an electrical or magnetic effect may be included. Examples of display devices having EL elements include an EL display. Examples of display devices including electron emitters are a field emission display (FED) and an SED-type flat panel display (SED: surface-conduction electron-emitter display). Examples of display devices including liquid crystal elements are a liquid crystal display (e.g., a transmissive liquid crystal display, a transflective liquid crystal display, a reflective liquid crystal display, a direct-view liquid crystal display, and a projection liquid crystal display). Examples of display devices including electronic ink, electronic liquid powder (registered trademark), or electrophoretic elements are electronic paper. In a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as SRAM can be provided under the reflective electrodes, leading to lower power consumption. In the case of using an LED, graphene or graphite may be provided under an electrode or a nitride semiconductor of the LED. Graphene or graphite may be a multilayer film in which a plurality of layers are stacked. Providing graphene or graphite enables a nitride semiconductor (e.g., an n-type GaN semiconductor layer including crystals) to be easily formed thereover. Furthermore, providing a p-type GaN semiconductor layer including crystals or the like thereover can form the LED. Note that an MN layer may be provided between graphene or graphite and the n-type GaN semiconductor layer including crystals. The GaN semiconductor layers included in the LED may be formed by MOCVD.

Note that when the graphene is provided, the GaN semiconductor layers included in the LED can also be formed by a sputtering method.

Embodiment 3

In this embodiment, an application example of the semiconductor device described in the foregoing embodiments to an electronic component, application examples of the electronic component to a display module, an application example of the display module, and application examples of an electronic device will be described with reference to FIGS. 15A and 15B, FIGS. 16A and 16B, FIG. 17, and FIGS. 18A to 18E.

Figure 15A:
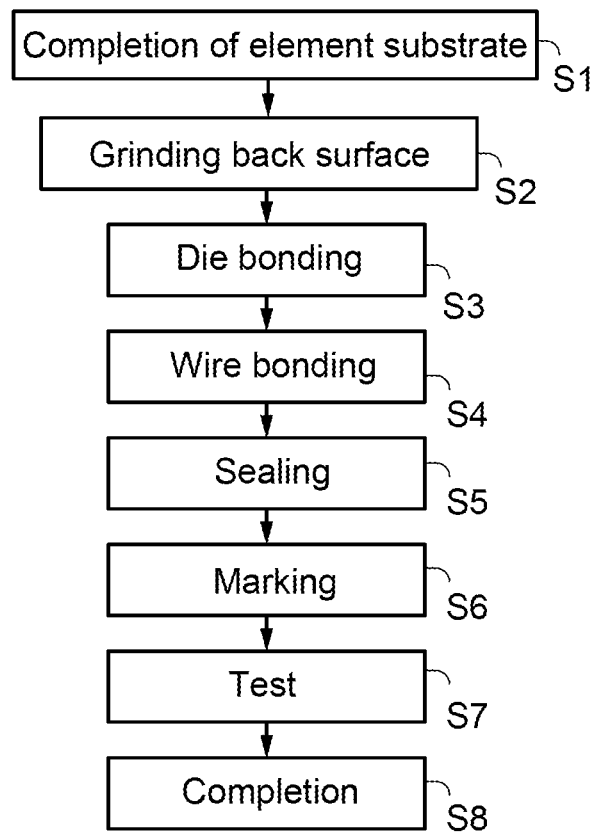
FIG. 15A is a flowchart showing a fabrication process of an electronic component.

FIG. 15A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors illustrated in FIGS. 5A and 5B or FIGS. 8A and 8B is completed by integrating detachable components on a printed circuit board through the assembly process (post-process).

The post-process can be completed through steps shown in FIG. 15A. Specifically, after an element substrate obtained in the wafer process is completed (Step S1), a back surface of the substrate is ground (Step S2). The substrate is thinned in this step to reduce warpage or the like of the substrate in the wafer process and to reduce the size of the component itself.

A dicing step of grinding the back surface of the substrate to separate the substrate into a plurality of chips is performed. Then, a die bonding step of individually picking up separate chips to be mounted on and bonded to an interposer is performed (Step S3). To bond a chip and an interposer in the die bonding step, resin bonding, tape-automated bonding, or the like is selected as appropriate depending on products.

Next, wire bonding for electrically connecting a wire of the interposer and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, printing process (marking) is performed on a surface of the package (Step S6). Then, through a final test step (Step S7), the electronic component is completed (Step S8).

Since the electronic component described above includes the semiconductor device described in the foregoing embodiment, it is possible to obtain a small and highly reliable electronic component.

Figure 15B:
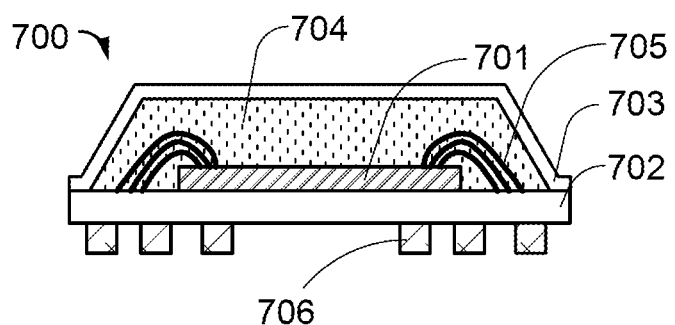
FIG. 15B is a schematic cross-sectional view of the electronic component.

FIG. 15B is a schematic cross-sectional view of a completed electronic component. In an electronic component 700 illustrated in FIG. 15B, a semiconductor device 701 is provided on a surface of an interposer 702. The semiconductor device 701 is connected to a wiring on the surface of the interposer 702 via a wire 705 to be electrically connected to a bump terminal 706 provided on the back surface of the interposer 702. The semiconductor device 701 over the interposer 702 is sealed by a package 703 with a space between the interposer 702 and the package 703 filled with an epoxy resin 704.

The electronic component 700 in FIG. 15B is mounted on a flexible printed circuit (FPC) or a display panel, for example.

Next, examples where the electronic component in FIG. 15B is mounted on a display panel will be described with reference to FIGS. 16A and 16B.

Figure 16A:
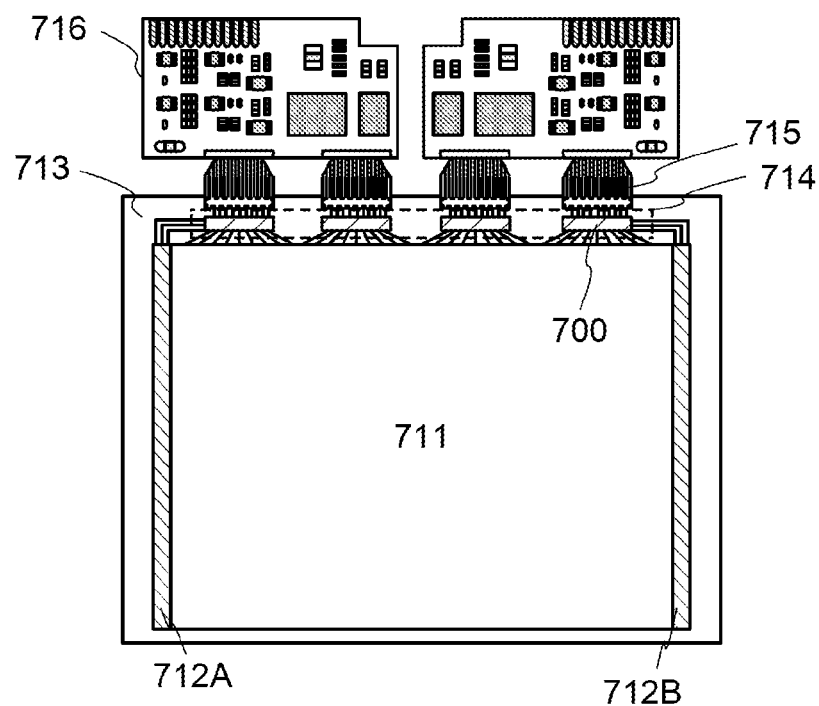
FIGS. 16A and 16B each illustrate a display panel including an electronic component.

FIG. 16A illustrates an example where a source driver 714 and gate drivers 712A and 712B are provided around a display portion 711 and a plurality of electronic components 700 are mounted on a substrate 713 as the source driver 714.

The electronic components 700 are mounted on the substrate 713 using an anisotropic conductive adhesive and an anisotropic conductive film.

The electronic components 700 are connected to an external circuit board 716 via FPCs 715.

Figure 16B:
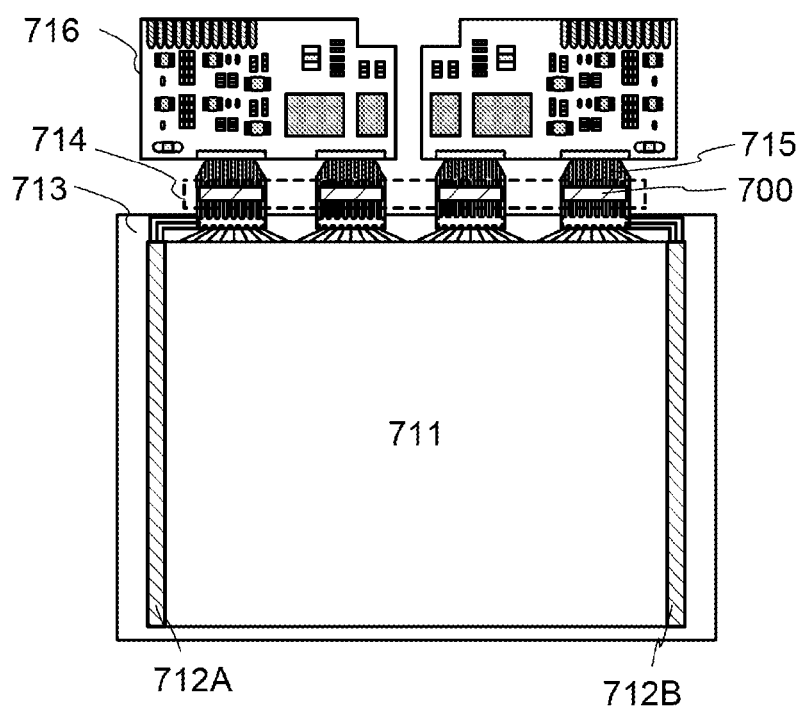

FIG. 16B illustrates an example where the source driver 714 and the gate drivers 712A and 712B are provided around the display portion 711 and a plurality of electronic components 700 are mounted on the FPCs 715 as the source driver 714.

Mounting the electronic components 700 on the FPCs 715 allows a larger display portion 711 to be provided over the substrate 713, resulting in a narrower frame.

Next, an application example of a display module using the display panel illustrated in FIG. 16A or FIG. 16B will be described with reference to FIG. 17.

Figure 17:
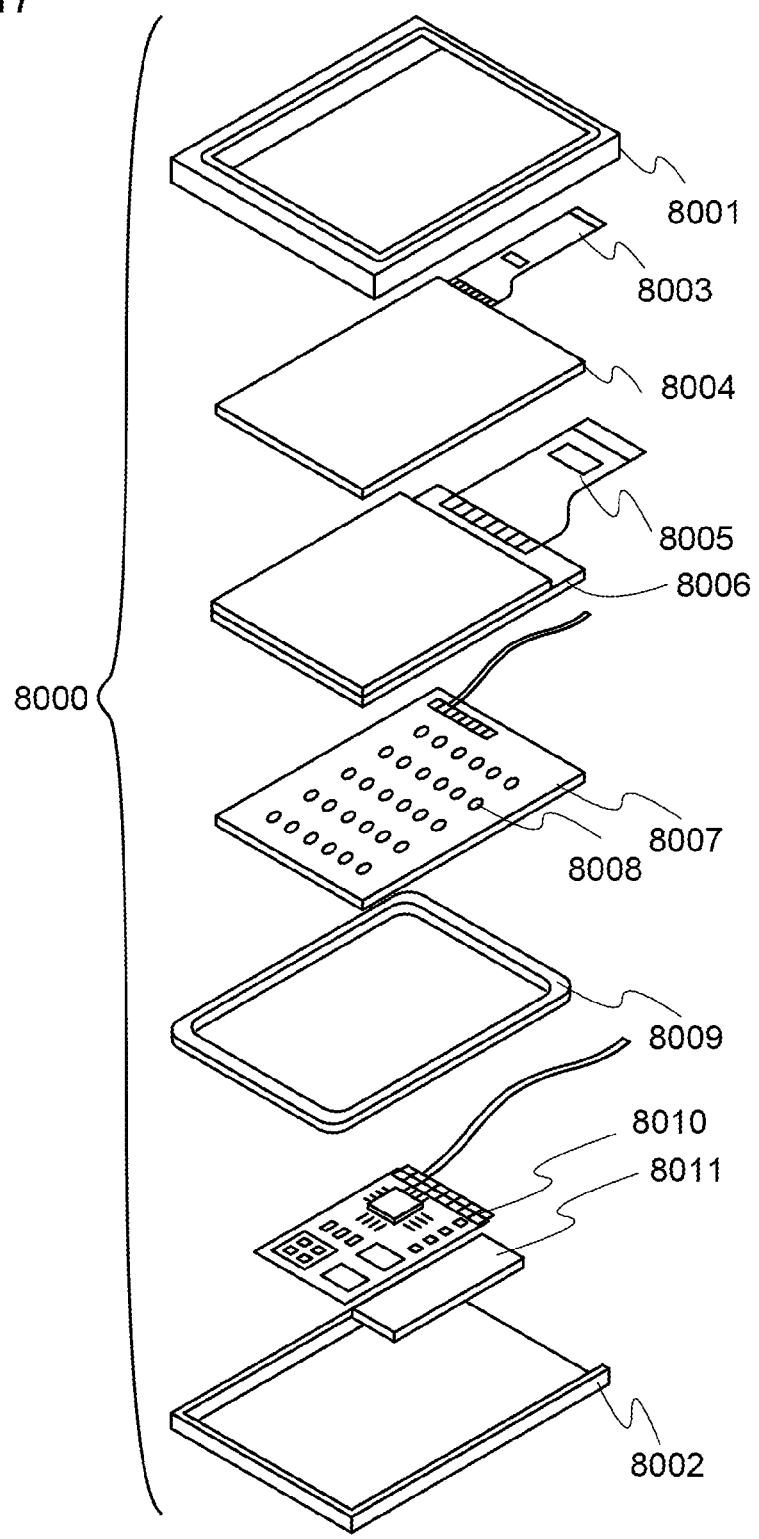
FIG. 17 illustrates a display module including a display panel.

In a display module 8000 illustrated in FIG. 17, a touch panel 8004 connected to an FPC 8003, a display panel 8006 connected to an FPC 8005, a backlight unit 8007, a frame 8009, a printed circuit board 8010, and a battery 8011 are provided between an upper cover 8001 and a lower cover 8002. Note that the backlight unit 8007, the battery 8011, the touch panel 8004, and the like are not provided in some cases.

The display panel illustrated in FIG. 16A or FIG. 16B can be used as the display panel 8006 in FIG. 17.

The shape and size of the upper cover 8001 and the lower cover 8002 can be changed as appropriate in accordance with the size of the touch panel 8004 and the display panel 8006.

The touch panel 8004 can be a resistive touch panel or a capacitive touch panel and can be formed to overlap the display panel 8006. It is also possible to provide a touch panel function for a counter substrate (sealing substrate) of the display panel 8006. Alternatively, a photosensor may be provided in each pixel of the display panel 8006 to form an optical touch panel. Further alternatively, an electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and functions as an electromagnetic shield for blocking electromagnetic waves generated by the operation of the printed circuit board 8010. The frame 8009 may also function as a radiator plate.

The printed circuit board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a polarizing plate, a retardation plate, a prism sheet, or the like.

Next, the description is made on the case where a display panel including the above electronic component is used as a display panel of an electronic device such as a computer, a portable information appliance (including a mobile phone, a portable game machine, and an audio reproducing device), electronic paper, a television device (also referred to as television or television receiver), or a digital video camera.

Figure 18A:
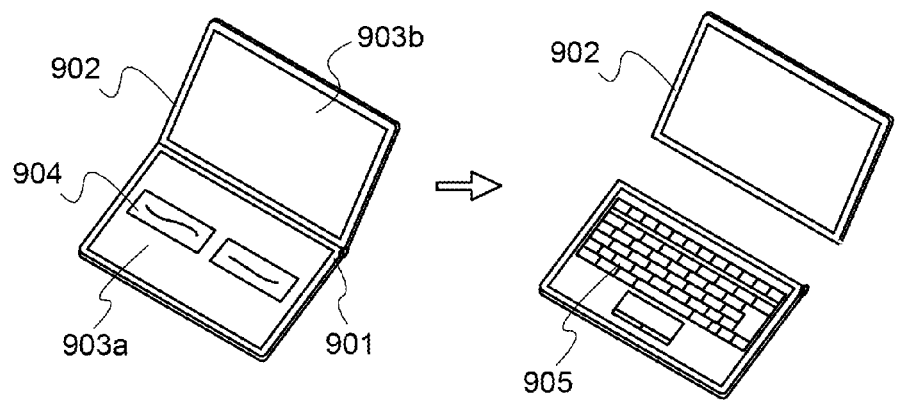
FIGS. 18A to 18E each illustrate an electronic device including an electronic component.

FIG. 18A illustrates a portable information appliance that includes a housing 901, a housing 902, a first display portion 903a, a second display portion 903b, and the like. At least one of the housings 901 and 902 is provided with the electronic component including the semiconductor device of the foregoing embodiment. It is thus possible to obtain a small and highly reliable portable information appliance.

The first display portion 903a is a panel having a touch input function, and for example, as illustrated in the left of FIG. 18A, which of "touch input" and "keyboard input" is performed can be selected by a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 18A. Thus, letters can be input quickly by key input as in a conventional information appliance, for example.

One of the first display portion 903a and the second display portion 903b can be detached from the portable information appliance as shown in the right of FIG. 18A.

Providing the second display portion 903b with a touch input function makes the information appliance convenient because a weight to carry around can be further reduced and the information appliance can operate with one hand while the other hand supports the housing 902.

The portable information appliance in FIG. 18A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance in FIG. 18A may transmit and receive data wirelessly. Through wireless communication, desired book data or the like can be purchased and downloaded from an e-book server.

In addition, the housing 902 in FIG. 18A may be equipped with an antenna, a microphone function, and a wireless communication function to be used as a mobile phone.

Figure 18B:
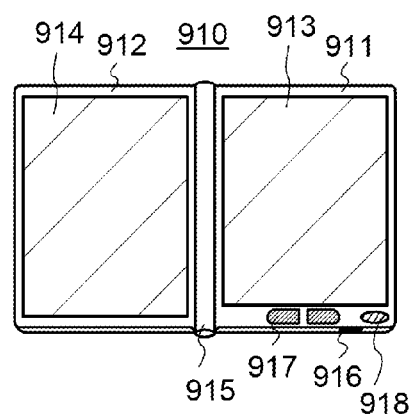

FIG. 18B illustrates an e-book reader 910 including electronic paper. The e-book reader 910 has two housings 911 and 912. The housing 911 and the housing 912 are provided with a display portion 913 and a display portion 914, respectively. The housings 911 and 912 are connected by a hinge 915 and can be opened and closed with the hinge 915 as an axis. The housing 911 is provided with a power switch 916, an operation key 917, a speaker 918, and the like. The electronic component including the semiconductor device of the foregoing embodiment is provided in at least one of the housings 911 and 912. It is thus possible to obtain a small and highly reliable e-book reader.

Figure 18C:
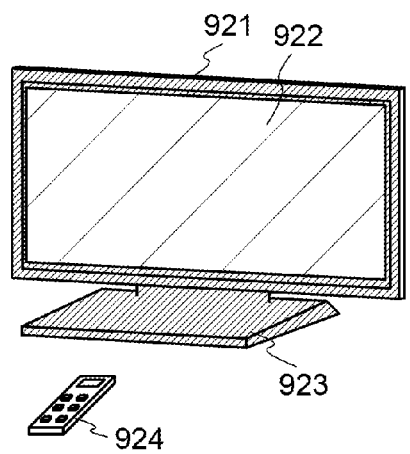

FIG. 18C illustrates a television device including a housing 921, a display portion 922, a stand 923, and the like. The television device can be controlled by a switch of the housing 921 and a remote controller 924. The electronic component including the semiconductor device of the foregoing embodiment is mounted on the housing 921 and the remote controller 924. Thus, it is possible to obtain a small and highly reliable television device.

Figure 18D:
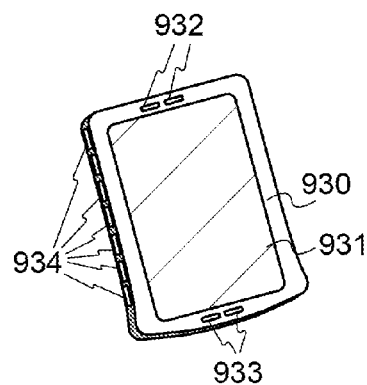

FIG. 18D illustrates a smartphone in which a main body 930 is provided with a display portion 931, a speaker 932, a microphone 933, an operation button 934, and the like. The electronic component including the semiconductor device of the foregoing embodiment is provided in the main body 930. It is therefore possible to obtain a small and highly reliable smartphone.

Figure 18E:
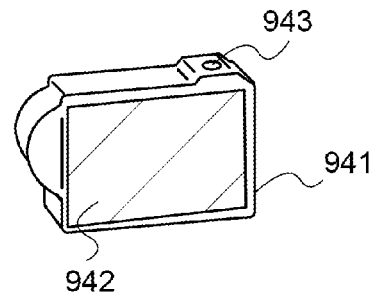

FIG. 18E illustrates a digital camera including a main body 941, a display portion 942, an operation switch 943, and the like. The electronic component including the semiconductor device of the foregoing embodiment is provided in the main body 941. Consequently, it is possible to obtain a small and highly reliable digital camera.

As described above, the electronic device shown in this embodiment incorporates the electronic component including the semiconductor device of the foregoing embodiment, thereby being reduced in size and having high reliability.

EXPLANATION OF REFERENCE

CO: contact, DL1: wiring, DL2: wiring, GE: gate, GL: gate line, ML: wiring, Ni: transistor, N2: transistor, $P_1$: transistor, $P_2$: transistor, SL: source line, SEM: semiconductor, V1: high power supply potential, VDD: high power supply potential, VSS: low power supply potential, 10: PTL, 11: transistor, 12: transistor, 13: transistor, 14: transistor, 15: transistor, 16: transistor, 17: transistor, 18: transistor, 21: transistor, 22: transistor, 23: transistor, 24: transistor, 25: transistor, 26: transistor, 27: transistor, 28: transistor, 30: PTL, 100: source driver, 101: gate driver, 102: display portion, 103: pixel, 103a: pixel circuit, 103b: pixel circuit, 103c: pixel circuit, 104: compensation circuit, 201: substrate, 202: channel, 203a: impurity region, 203b: impurity region, 204a: impurity region, 204b: impurity region, 205: element isolation layer, 207: sidewall insulating layer, 208: insulating film, 211: substrate, 212: channel, 213a: impurity region, 213b: impurity region, 214a: impurity region, 214b: impurity region, 215: element isolation layer, 217: sidewall insulating layer, 218: insulating film, 221: semiconductor, 222: semiconductor, 223: semiconductor, 550: transistor, 552: transistor, 554: transistor, 560: capacitor, 562: capacitor, 570: liquid crystal element, 572: light-emitting element, 664: light-emitting element, 665: transistor, 666: transistor, 667: transistor, 668: capacitor, 700: electronic component, 701: semiconductor device, 702: interposer, 703: package, 704: epoxy resin, 705: wire, 706: bump terminal, 711: display portion, 712A: gate driver, 712B: gate driver, 713: substrate, 714: source driver, 715: FPC, 716: external circuit board, 901: housing, 902: housing, 903a: display portion, 903b: display portion, 904: selection button, 905: keyboard, 910: e-book reader, 911: housing, 912: housing, 913: display portion, 914: display portion, 915: hinge, 916: power switch, 917: operation key, 918: speaker, 921: housing, 922: display portion, 923: stand, 924: remote controller, 930: main body, 931: display portion, 932: speaker, 933: microphone, 934: operation button, 941: main body, 942: display portion, 943: operation switch, 8000: display module, 8001: upper cover, 8002: lower cover, 8003: FPC, 8004: touch panel, 8005: FPC, 8006: display panel, 8007: backlight unit, 8008: light source, 8009: frame, 8010: printed circuit board, 8011: battery This application is based on Japanese Patent Application serial No. 2014-181113 filed with Japan Patent Office on Sep. 5, 2014, the entire contents of which are hereby incorporated by reference.

The invention claimed is:

1. A semiconductor device comprising:
first to seventh transistors and first to fifth wirings,
wherein:
a gate of the first transistor is electrically connected to the first wiring,
one of a source and a drain of the first transistor is supplied with a first voltage,
the other of the source and the drain of the first transistor is electrically connected to one of a source and a drain of the fifth transistor,
a gate of the second transistor is electrically connected to the second wiring,
one of a source and a drain of the second transistor is supplied with a second voltage,
the other of the source and the drain of the second transistor is electrically connected to the one of the source and the drain of the fifth transistor,
a gate of the third transistor is electrically connected to the first wiring,
one of a source and a drain of the third transistor is supplied with a third voltage,
the other of the source and the drain of the third transistor is electrically connected to one of a source and a drain of the sixth transistor,
a gate of the fourth transistor is electrically connected to the second wiring,
one of a source and a drain of the fourth transistor is supplied with a fourth voltage,
the other of the source and the drain of the fourth transistor is electrically connected to the one of the source and the drain of the sixth transistor,
a gate of the fifth transistor is electrically connected to the third wiring,
the other of the source and the drain of the fifth transistor is electrically connected to one of a source and a drain of the seventh transistor,
a gate of the sixth transistor is electrically connected to the fourth wiring,
the other of the source and the drain of the sixth transistor is electrically connected to the one of the source and the drain of the seventh transistor,
a gate of the seventh transistor is electrically connected to the fifth wiring,
the first wiring is supplied with a first signal,
the second wiring is supplied with an inversion signal of the first signal,
the third wiring is supplied with a second signal,
the fourth wiring is supplied with an inversion signal of the second signal,
the fifth wiring is supplied with a third signal, and
a channel width of each of the first to fourth transistors is smaller than a channel width of each of the fifth to seventh transistors.

2. The semiconductor device according to claim 1, wherein the first to fourth transistors are arranged in one line.

3. The semiconductor device according to claim 1, wherein the first to seventh transistors have a same conductivity type.

4. The semiconductor device according to claim 1, wherein the channel width of each of the fifth to seventh transistors is larger than two times and smaller than eight times the channel width of each of the first to fourth transistors.

5. The semiconductor device according to claim 1, wherein one of the first to fourth voltages is selected in response to the first to third signals and is output to the other of the source and the drain of the seventh transistor.

6. An electronic component comprising a bump terminal electrically connected to the semiconductor device according to claim 1.

7. An electronic device comprising a display device and the electronic component according to claim 6.

8. A semiconductor device comprising:
first to seventh transistors and first to fifth wirings,
wherein:
the first to seventh transistors are p-channel transistors,
a gate of the first transistor is electrically connected to the first wiring,
one of a source and a drain of the first transistor is supplied with a first voltage,
the other of the source and the drain of the first transistor is electrically connected to one of a source and a drain of the fifth transistor,
a gate of the second transistor is electrically connected to the second wiring,
one of a source and a drain of the second transistor is supplied with a second voltage,
the other of the source and the drain of the second transistor is electrically connected to the one of the source and the drain of the fifth transistor, a gate of the third transistor is electrically connected to the first wiring, one of a source and a drain of the third transistor is supplied with a third voltage, the other of the source and the drain of the third transistor is electrically connected to one of a source and a drain of the sixth transistor, a gate of the fourth transistor is electrically connected to the second wiring, one of a source and a drain of the fourth transistor is supplied with a fourth voltage, the other of the source and the drain of the fourth transistor is electrically connected to the one of the source and the drain of the sixth transistor, a gate of the fifth transistor is electrically connected to the third wiring, the other of the source and the drain of the fifth transistor is electrically connected to one of a source and a drain of the seventh transistor, a gate of the sixth transistor is electrically connected to the fourth wiring, the other of the source and the drain of the sixth transistor is electrically connected to the one of the source and the drain of the seventh transistor, a gate of the seventh transistor is electrically connected to the fifth wiring, the first wiring is supplied with a first signal, the second wiring is supplied with an inversion signal of the first signal, the third wiring is supplied with a second signal, the fourth wiring is supplied with an inversion signal of the second signal, the fifth wiring is supplied with a third signal, and a channel width of each of the first to fourth transistors is smaller than a channel width of each of the fifth to seventh transistors.

9. The semiconductor device according to claim 8, wherein the first to fourth transistors are arranged in one line.

10. The semiconductor device according to claim 8, wherein the channel width of each of the fifth to seventh transistors is larger than two times and smaller than eight times the channel width of each of the first to fourth transistors.

11. The semiconductor device according to claim 8, wherein one of the first to fourth voltages is selected in response to the first to third signals and is output to the other of the source and the drain of the seventh transistor.

12. An electronic component comprising a bump terminal electrically connected to the semiconductor device according to claim 8.

13. An electronic device comprising a display device and the electronic component according to claim 12.

* * * * *